United States Patent
Kim et al.

(10) Patent No.: US 8,938,020 B2
(45) Date of Patent: Jan. 20, 2015

(54) METHOD AND DEVICE FOR TRANSMITTING/RECEIVING A SIGNAL BY USING A CODE BOOK IN A WIRELESS COMMUNICATION SYSTEM

(75) Inventors: Hyungtae Kim, Anyang-si (KR); Kijun Kim, Anyang-si (KR); Daewon Lee, Anyang-si (KR)

(73) Assignee: LG Electronics Inc., Seoul (KR)

( * ) Notice: Subject to any disclaimer, the term of this patent is extended or adjusted under 35 U.S.C. 154(b) by 72 days.

(21) Appl. No.: 13/808,544

(22) PCT Filed: Jul. 7, 2011

(86) PCT No.: PCT/KR2011/004973
§ 371 (c)(1),
(2), (4) Date: Jan. 4, 2013

(87) PCT Pub. No.: WO2012/008710
PCT Pub. Date: Jan. 19, 2012

(65) Prior Publication Data
US 2013/0107920 A1    May 2, 2013

Related U.S. Application Data

(60) Provisional application No. 61/363,631, filed on Jul. 12, 2010, provisional application No. 61/363,283, filed on Jul. 12, 2010, provisional application No. 61/363,282, filed on Jul. 12, 2010, provisional application No. 61/364,003, filed on Jul. 13, 2010.

(51) Int. Cl.
*H04B 7/02* (2006.01)
*H04B 7/04* (2006.01)
(Continued)

(52) U.S. Cl.
CPC ............ *H04B 7/0456* (2013.01); *H04L 1/0031* (2013.01); *H04L 1/06* (2013.01);
(Continued)

(58) Field of Classification Search
CPC .... H04B 7/0639; H04B 7/024; H04B 7/0456; H04B 7/0486; H04B 7/065; H04B 7/0626; H04B 7/0634; H04B 7/0413; H04B 1/38; H04B 1/62; H04L 1/0026; H04L 2025/03426
USPC ................. 375/267, 260, 259, 219, 295, 316
See application file for complete search history.

(56) References Cited

U.S. PATENT DOCUMENTS

2010/0074353 A1*  3/2010  Zhou et al. ................... 375/260
2010/0091893 A1*  4/2010  Gorokhov .................... 375/260
(Continued)

FOREIGN PATENT DOCUMENTS

KR   10-2008-0083556 A   9/2008
KR   10-2009-0017352 A   2/2009
(Continued)

*Primary Examiner* — Kenneth Lam
(74) *Attorney, Agent, or Firm* — Birch, Stewart, Kolasch & Birch, LLP

(57) ABSTRACT

The present invention relates to a wireless communication system, and more particularly, to a method and device for transmitting/receiving a signal by using a codebook. According to an embodiment of the present invention, the method for a transmitter supporting Nt antennas to attain the technical objects thereof and transmit a signal to a receive includes selecting the precoding matrix indicated by the combination of a first precoding matrix indicator (PMI) and a second PMI, precoding the signal by using the selected precoding matrix, and transmitting the precoded signal through the Nt antennas. Here, the first PMI may indicate one matrix group among N matrix groups (N≥1) including matrices representing channel directions related to the Nt antennas. Additionally, the precoding matrix may be selected by multiplying the one matrix group indicated by the first PMI by the matrix indicated by the second PMI.

12 Claims, 13 Drawing Sheets

(51) Int. Cl.
*H04L 1/00* (2006.01)
*H04L 1/06* (2006.01)
*H04B 1/38* (2006.01)
*H04B 1/62* (2006.01)
*H04B 7/06* (2006.01)
*H03M 13/09* (2006.01)

(52) U.S. Cl.
CPC . *H04B 1/38* (2013.01); *H04B 1/62* (2013.01); *H04B 7/0478* (2013.01); *H04B 7/065* (2013.01); *H04B 7/0639* (2013.01); *H03M 13/09* (2013.01); *H04L 1/0003* (2013.01); *H04L 1/0009* (2013.01); *H04L 1/0026* (2013.01); *H04B 7/0469* (2013.01)
USPC .......... 375/267; 375/260; 375/259; 375/219; 375/295; 375/316

(56) References Cited

U.S. PATENT DOCUMENTS

| | | |
|---|---|---|
| 2010/0111226 A1 | 5/2010 | Ko et al. |
| 2010/0309998 A1 | 12/2010 | Jung et al. |
| 2010/0310000 A1* | 12/2010 | Ko et al. ................ 375/260 |
| 2011/0064051 A1* | 3/2011 | Clerckx et al. ............ 370/331 |
| 2011/0096859 A1 | 4/2011 | Kim et al. |
| 2011/0268207 A1* | 11/2011 | Choi et al. ............... 375/267 |
| 2011/0274188 A1* | 11/2011 | Sayana et al. ............ 375/260 |
| 2013/0058307 A1* | 3/2013 | Kim et al. ............... 370/329 |

FOREIGN PATENT DOCUMENTS

| | | |
|---|---|---|
| KR | 10-2009-0073758 A | 7/2009 |
| KR | 10-2009-0083834 A | 8/2009 |

\* cited by examiner (a)

(b)

METHOD AND DEVICE FOR TRANSMITTING/RECEIVING A SIGNAL BY USING A CODE BOOK IN A WIRELESS COMMUNICATION SYSTEM

CROSS REFERENCE TO RELATED APPLICATIONS

This application is the National Phase of PCT/KR2011/004973 filed on Jul. 7, 2011, which claims priority under 35 U.S.C. 119(e) to U.S. Provisional Application No. 61/363,282 filed on Jul. 12, 2010, to U.S. Provisional Application No. 61/363,283 filed on Jul. 12, 2010, to U.S. Provisional Application No. 61/363,631 filed on Jul. 12, 2010 and to U.S. Provisional Application No. 61/364,003 filed on Jul. 13, 2010, all of which are hereby expressly incorporated by reference into the present application.

TECHNICAL FIELD

The present invention relates to a wireless communication system, and more particularly, to a method and device for transmitting and receiving a signal by using a codebook.

BACKGROUND ART

Multi-Input Multi-Output (MIMO) technology is to improve efficiency in data transmission and reception by using multiple transmitting antennas and multiple receiving antennas instead of a single transmitting antenna and a single receiving antenna. If a single antenna is used, a receiver receives data through a single antenna path. However, if multiple antennas are used, the receiver receives data through various paths. Accordingly, speed and amount in data transmission may be increased, and coverage may be increased.

As information fed back from a receiver (for example, user equipment) to a transmitter (for example, base station) in a multi-antenna wireless communication system, a rank indicator (RI), precoding matrix index (PMI), and channel quality information (CQI) are defined. This feedback information may be referred to as channel status information (CSI). The user equipment may feed its desired PMI and RI back to the base station on the basis of a result of channel measurement from the base station. In this case, if the RI desired by the user equipment is used by the base station in a given channel status, it corresponds to a downlink transmission rank value that may have the highest transmission rate. Also, the PMI desired by the user equipment is an index representing a precoding matrix suitable for a channel status measured by the user equipment, in a codebook which is a set of precoding matrix candidates. The codebook is previously determined and shared between the base station and the user equipment. Also, the CQI is calculated on the basis of PMI/RI reported by the user equipment, and corresponds to a modulation and coding scheme (MCS) level applied to downlink transmission. In this case, if precoder information and rank value based on the PMI/RI reported by the user equipment are used, the CQI may represent MCS level that provides an allowable packet error rate.

DISCLOSURE

Technical Problem

The introduction of a new system having antenna configuration more extended than that of the existing multi-antenna wireless communication system has been discussed. For example, although the existing system supports four transmitting antennas (4Tx), a new system having the extended antenna configuration may provide more increased system capacity by supporting MIMO transmission through eight transmitting antennas (8Tx).

Also, in order to normally perform communication based on a multiple user-MIMO (MU-MIMO) scheme, channel status feedback that may represent a channel status more exactly than communication based on a single user-MIMO (SU-MIMO) scheme will be required. In particular, in case of PMI feedback based on a previously determined codebook, it is important that a codebook, which includes precoding matrixes representing a channel status more exactly, should be designed.

Accordingly, an object of the present invention devised to solve the conventional problem is to provide a method and device for codebook based MIMO transmission and reception, in which a channel status may be reflected more exactly in a system having an extended antenna configuration.

It will be appreciated by persons skilled in the art that the objects that could be achieved with the present invention are not limited to what has been particularly described hereinabove and the above and other objects that the present invention could achieve will be more clearly understood from the following detailed description.

Technical Solution

To solve the aforementioned technical problems, according to one embodiment of the present invention, a method for transmitting a signal from a transmitter, which supports Nt antennas, to a receiver comprises the steps of selecting a precoding matrix indicated by combination of a first precoding matrix indicator (PMI) and a second PMI; precoding the signal by using the selected precoding matrix; and transmitting the precoded signal through the Nt antennas. In this case, the first PMI may indicate one matrix group among N matrix groups (N≥1) including matrixes representing channel directions related to the Nt antennas. Also, the precoding matrix may be selected by multiplying the one matrix group indicated by the first PMI by the matrix indicated by the second PMI.

To solve the aforementioned technical problems, according to another embodiment of the present invention, a method for processing a signal transmitted from a transmitter, which supports Nt antennas, through a receiver, comprises the steps of receiving the signal from the transmitter; selecting a precoding matrix indicated by combination of a first precoding matrix indicator (PMI) and a second PMI; and recovering the signal by performing inverse processing of precoding for the received signal by using the selected precoding matrix. In this case, the first PMI may indicate one matrix group among N matrix groups (N≥1) including matrixes representing channel directions related to the Nt antennas. Also, the precoding matrix may be selected by multiplying the one matrix group indicated by the first PMI by the matrix indicated by the second PMI.

To solve the aforementioned technical problems, according to still another embodiment of the present invention, a transmitter transmitting a signal comprises Nt antennas; a transmission module transmitting the signal to a receiver; a reception module receiving the signal from the receiver; and a processor controlling an operation of the transmitter. In this case, the processor may be configured to select a precoding matrix indicated by combination of a first precoding matrix indicator (PMI) and a second PMI, precode the signal by using the selected precoding matrix, and transmit the precoded signal through the Nt antennas. The first PMI may indicate one matrix group among N matrix groups (N≥1) including matrixes representing channel directions related to the Nt antennas. Also, the precoding matrix may be selected by multiplying the one matrix group indicated by the first PMI by the matrix indicated by the second PMI.

To solve the aforementioned technical problems, according to further still another embodiment of the present invention, a receiver receiving a signal comprises a reception module receiving the signal from a transmitter which includes Nt antennas; a transmission module transmitting the signal to the transmitter; and a processor controlling an operation of the receiver, wherein the processor receives the signal from the transmitter through the reception module, selects a precoding matrix indicated by combination of a first precoding matrix indicator (PMI) and a second PMI, and recovers the signal by performing inverse processing of precoding for the received signal by using the selected precoding matrix, and the first PMI indicates one matrix group among N matrix groups (N≥1) including matrixes representing channel directions related to the Nt antennas, and the precoding matrix is selected by multiplying the one matrix group indicated by the first PMI by the matrix indicated by the second PMI.

The followings may commonly be applied to the aforementioned embodiments of the present invention.

The matrix indicated by the second PMI may be the matrix that applies one or more of phase rotation, size modification and vector selection to the one matrix group indicated by the first PMI.

Each of the N matrix groups may include matrixes of high correlation, or each of the N matrix groups includes a plurality of subgroups orthogonal to one another, each of the subgroups including matrixes of high correlation.

N=1 may be obtained, and the one matrix group related to the first PMI may include all the precoding matrixes that may be selected.

The first PMI may be indicated by a third PMI and a fourth PMI, the third PMI may indicate one of diagonal matrixes of Nt×Nt size, the fourth PMI may indicate one of block diagonal matrixes of Nt×2 size, the second PMI may indicate one of matrixes of 2×R size, and R may be the number of layers to which the signal is transmitted.

In this case, diagonal components in each of the diagonal matrixes related to the third PMI may be configured such that phase is increased linearly, one block in each of the block diagonal matrixes related to the fourth PMI may be configured as a matrix of (Nt/2)×1 size and components of the one block may be configured such that phase is increased linearly, and first and second rows of the second PMI may be configured to have phase difference of $\alpha$.

The aforementioned embodiments and the following detailed description of the present invention are only exemplary, and are for additional description of the present invention cited in claims.

Advantageous Effects

According to the present invention, a method and device for codebook based MIMO transmission and reception may be provided, in which a channel status may be reflected more exactly in a system having an extended antenna configuration.

It will be appreciated by persons skilled in the art that the effects that could be achieved with the present invention are not limited to what has been particularly described hereinabove and other advantages of the present invention will be more clearly understood from the following detailed description.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

BEST MODE FOR CARRYING OUT THE INVENTION

Figure 1:
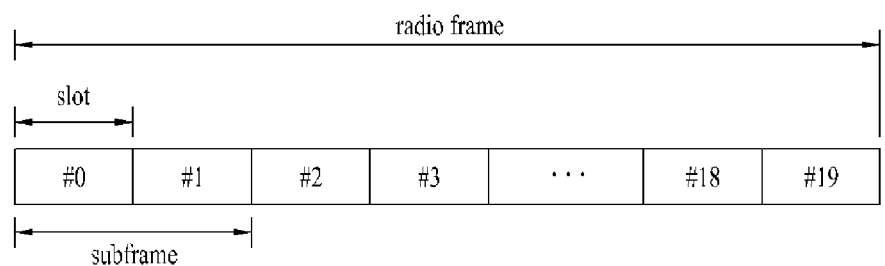
FIG. 1 is a diagram illustrating a structure of a type 1 radio frame.

The following embodiments are achieved by combination of structural elements and features of the present invention in a predetermined type. Each of the structural elements or features should be considered selectively unless specified separately. Each of the structural elements or features may be carried out without being combined with other structural elements or features. Also, some structural elements and/or features may be combined with one another to constitute the embodiments of the present invention. The order of operations described in the embodiments of the present invention may be changed. Some structural elements or features of one embodiment may be included in another embodiment, or may be replaced with corresponding structural elements or features of another embodiment.

In this specification, the embodiments of the present invention have been described based on data transmission and reception between a base station and a user equipment. In this case, the base station means a terminal node of a network, which performs direct communication with the user equipment. A specific operation which has been described as being performed by the base station may be performed by an upper node of the base station as the case may be.

In other words, it will be apparent that various operations performed for communication with the user equipment in the network which includes a plurality of network nodes along with the base station may be performed by the base station or network nodes other than the base station. The base station (BS) may be replaced with terms such as a fixed station, Node B, eNode B (eNB), and an access point (AP). Also, in this specification, the term, base station may be used as a concept that includes a cell or sector. For example, in the present invention, a serving base station may be referred to as a serving cell and a cooperative base station may be referred to as a cooperative cell. Also, a terminal may be replaced with terms such as a user equipment (UE), a mobile station (MS), a mobile subscriber station (MSS), or a subscriber station (SS).

Specific terminologies hereinafter used in the embodiments of the present invention are provided to assist understanding of the present invention, and various modifications may be made in the specific terminologies within the range that they do not depart from technical spirits of the present invention.

In some cases, to prevent the concept of the present invention from being ambiguous, structures and apparatuses of the known art will be omitted, or will be shown in the form of a block diagram based on main functions of each structure and apparatus. Also, wherever possible, the same reference numbers will be used throughout the drawings and the specification to refer to the same or like parts.

The embodiments of the present invention may be supported by standard documents disclosed in at least one of wireless access systems, i.e., IEEE 802 system, 3GPP system, 3GPP LTE system, 3GPP LTE and LTE-A (LTE-Advanced) system, and 3GPP2 system. Namely, among the embodiments of the present invention, apparent steps or parts, which are not described to clarify technical spirits of the present invention, may be supported by the above documents. Also, all terminologies disclosed herein may be described by the above standard documents.

The following technology may be used for various wireless access systems such as code division multiple access (CDMA), frequency division multiple access (FDMA), time division multiplex access (TDMA), orthogonal frequency division multiple access (OFDMA), and single carrier frequency division multiple access (SC-FDMA). The CDMA may be implemented by the radio technology such as universal terrestrial radio access (UTRA) or CDMA2000. The TDMA may be implemented by the radio technology such as global system for mobile communications (GSM)/general packet radio service (GPRS)/enhanced data rates for GSM evolution (EDGE). The OFDMA may be implemented by radio technology such as IEEE 802.11 (Wi-Fi), IEEE 802.16 (WiMAX), IEEE 802.20, and evolved UTRA (E-UTRA). The UTRA is a part of a universal mobile telecommunications system (UMTS). A 3rd generation partnership project long term evolution (3GPP LTE) communication system is a part of an evolved UMTS (E-UMTS) that uses E-UTRA, and uses OFDMA on a downlink and SC-FDMA on an uplink. LTE-advanced (LTE-A) is an evolved version of the 3GPP LTE. WiMAX may be described by the IEEE 802.16e standard (WirelessMAN-OFDMA Reference System) and the advanced IEEE 802.16m standard (WirelessMAN-OFDMA Advanced system). Although the following description will be based on the 3GPP LTE system and the 3GPP LTE-A system to clarify description, it is to be understood that technical spirits of the present invention are not limited to the 3GPP LTE and the 3GPP LTE-A system.

A structure of a downlink radio frame will be described with reference to FIG. 1 and FIG. 2.

In a cellular OFDM wireless packet communication system, uplink/downlink data packet transmission is performed in a subframe unit, wherein one subframe is defined by a given time interval that includes a plurality of OFDM symbols. The 3GPP LTE standard supports a type 1 radio frame structure applicable to frequency division duplex (FDD) and a type 2 radio frame structure applicable to time division duplex (TDD).

FIG. 1 is a diagram illustrating a structure of a type 1 radio frame. The downlink radio frame includes 10 subframes, each of which includes two slots in a time domain. A time required to transmit one subframe will be referred to as a transmission time interval (TTI). For example, one subframe may have a length of 1 ms, and one slot may have a length of 0.5 ms. One slot includes a plurality of OFDM symbols in a time domain and a plurality of resource blocks (RB) in a frequency domain.

The number of OFDM symbols included in one slot may be varied depending on configuration of cyclic prefix (CP). Examples of the CP include extended CP and normal CP. For example, if the OFDM symbols are configured by normal CP, the number of OFDM symbols included in one slot may be 7. If the OFDM symbols are configured by extended CP, since the length of one OFDM symbol is increased, the number of OFDM symbols included in one slot is smaller than that of OFDM symbols in case of normal CP. In case of the extended CP, the number of OFDM symbols included in one slot may be 6. If a channel status is unstable like the case where the user equipment moves at high speed, the extended CP may be used to reduce inter-symbol interference.

If the normal CP is used, since one slot includes seven OFDM symbols, one subframe includes 14 OFDM symbols. At this time, first two or three OFDM symbols of each subframe may be allocated to a physical downlink control channel (PDCCH), and the other OFDM symbols may be allocated to a physical downlink shared channel (PDSCH).

Figure 2:
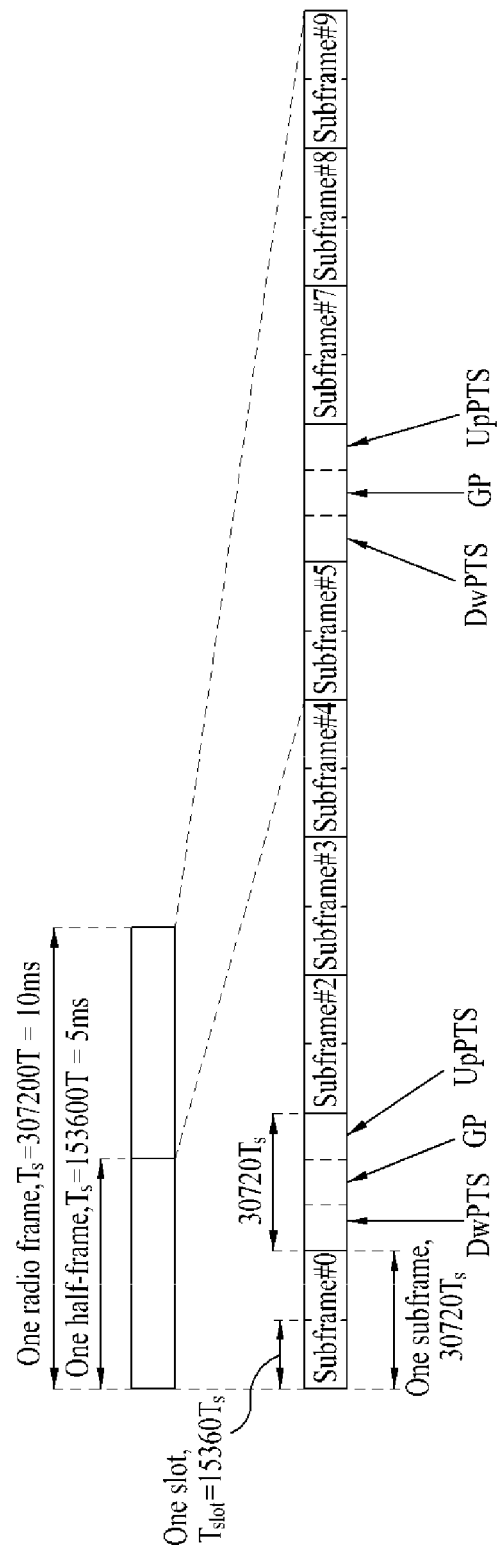
FIG. 2 is a diagram illustrating an example of a type 2 radio frame.

FIG. 2 is a diagram illustrating a structure of a type 2 radio frame. The type 2 radio frame includes two half frames, each of which includes five subframes. The subframes may be divided into normal subframes and special subframes. The special subframes may include three fields of a downlink pilot time slot (DwPTS), a guard period (GP), and an uplink pilot time slot (UpPTS). Although a length of these three fields may be set individually, the entire length of the three fields should be 1 ms. One of the subframes includes two slots. In other words, one subframe includes two slots regardless of a type of the radio frame.

The structure of the radio frame is only exemplary, and various modifications may be made in the number of subframes included in the radio frame, the number of slots included in the subframe, or the number of symbols included in the slot.

Figure 3:
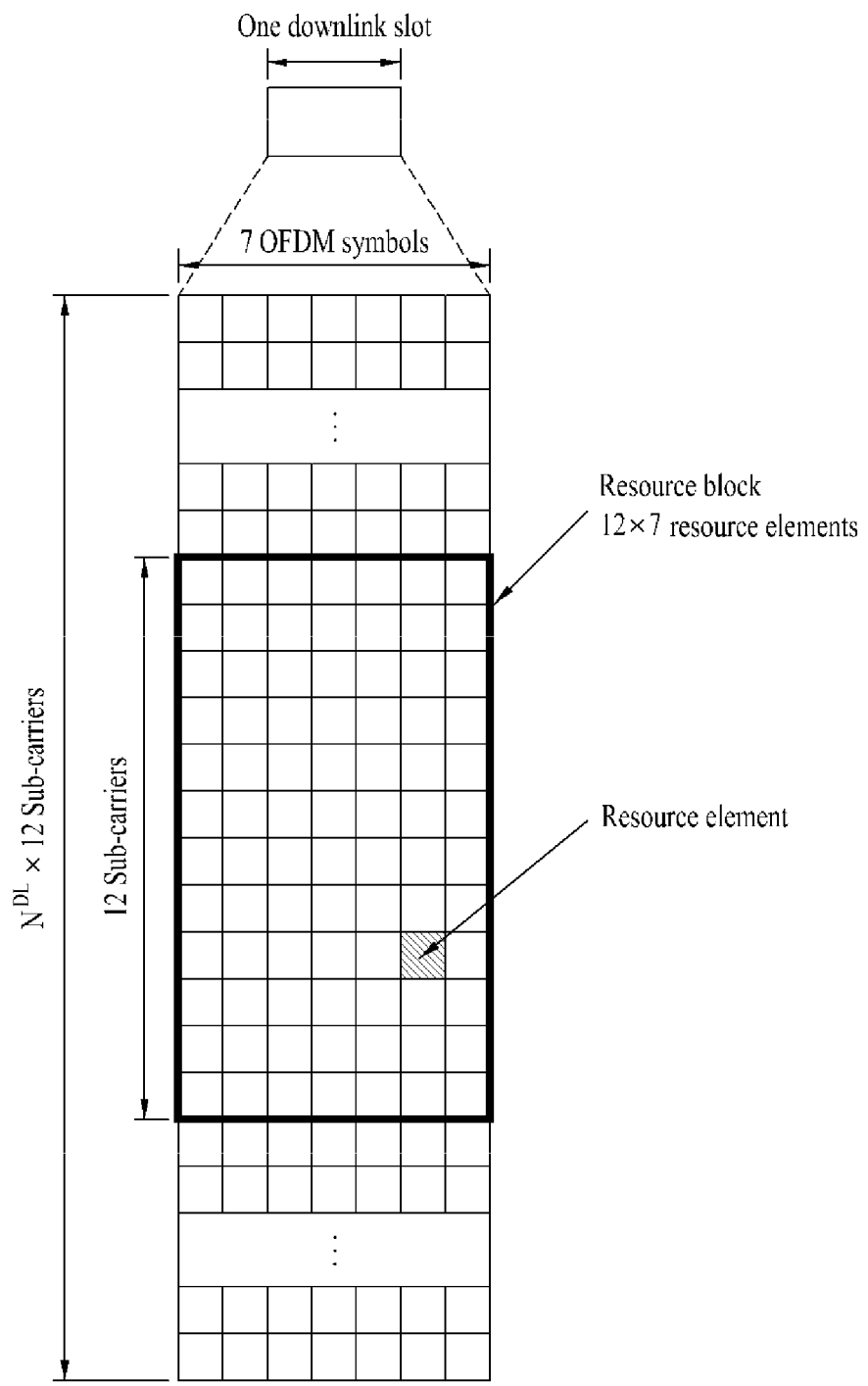
FIG. 3 is a diagram illustrating an example of a resource grid for one downlink slot.

FIG. 3 is a diagram illustrating an example of a resource grid for a downlink slot. In this case, OFDM symbols are configured by a normal CP. Referring to FIG. 3, a downlink slot includes a plurality of OFDM symbols in a time domain and a plurality of resource blocks in a frequency domain. In this case, one downlink slot includes, but not limited to, seven OFDM symbols, and one resource block (RB) includes, but not limited to, twelve subcarriers. Each element on the resource grid will be referred to as a resource element (RE). For example, resource element a(k, l) becomes the resource element located at the kth subcarrier and the first OFDM symbol. In case of the normal CP, one resource block includes 12×7 resource elements (in case of the extended CP, one resource block includes 12×6 resource elements). Since an interval between the respective subcarriers is 15 kHz, one resource block includes 180 kHz, approximately, in the frequency domain. $N^{DL}$ is the number of resource blocks included in the downlink slot. The value of $N^{DL}$ may be determined depending on a downlink transmission bandwidth set by scheduling of the base station.

Figure 4:
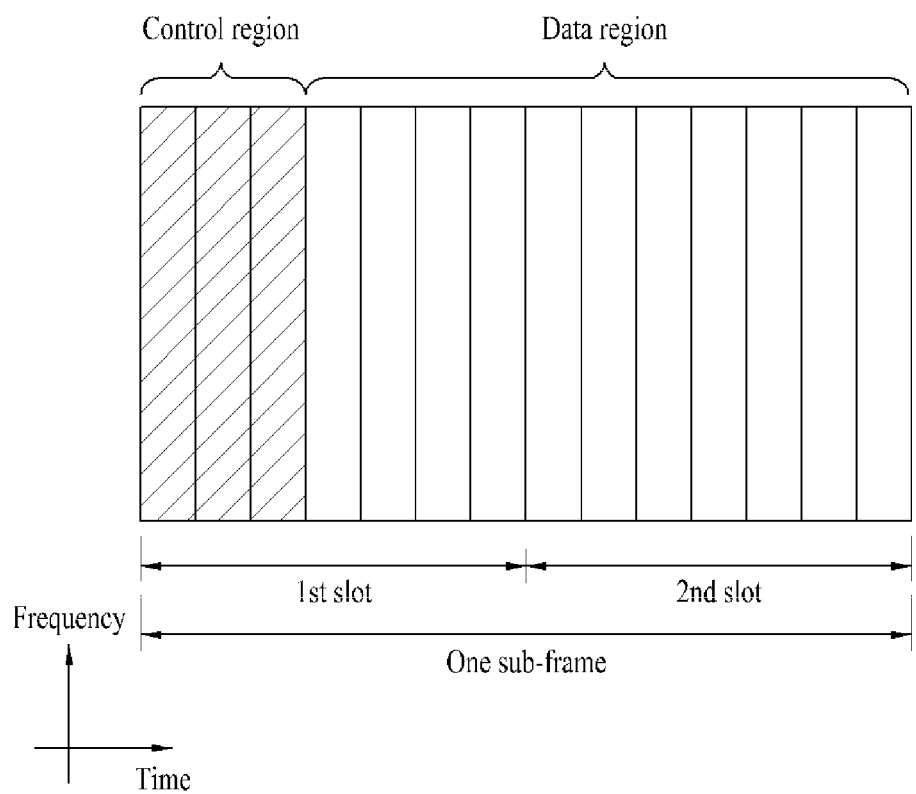
FIG. 4 is a diagram illustrating a structure of a downlink subframe.

FIG. 4 is a diagram illustrating a structure of a downlink subframe. Maximum three OFDM symbols located at the front of the first slot within one subframe correspond to a control region to which a control channel is allocated. The other OFDM symbols correspond to a data region to which a physical downlink shared channel (PDSCH) is allocated. A basic unit of transmission becomes one subframe. In other words, a PDCCH and a PDSCH are allocated to two slots. Examples of downlink control channels used in the 3GPP LTE system include a Physical Control Format Indicator Channel (PCFICH), a Physical Downlink Control Channel (PDCCH), and a Physical Hybrid ARQ Indicator Channel (PHICH). The PCFICH is transmitted from the first OFDM symbol of the subframe, and includes information on the number of OFDM symbols used for transmission of the control channel within the subframe. The PHICH includes HARQ ACK/NACK signal in response to uplink transmission. The control information transmitted through the PDCCH will be referred to as downlink control information (DCI). The DCI includes uplink or downlink scheduling information, or uplink transmission (Tx) power control command for a random user equipment group. The PDCCH may include transport format and resource allocation information of a downlink shared channel (DL-SCH), resource allocation information of an uplink shared channel (UL-SCH), paging information on a paging channel (PCH), system information on the DL-SCH, resource allocation information of upper layer control message such as random access response transmitted on the PDSCH, a set of transmission power control commands of individual user equipments (UEs) within a random user equipment group, transmission power control information, and activity information of voice over Internet protocol (VoIP). A plurality of PDCCHs may be transmitted within the control region. The user equipment may monitor the plurality of PDCCHs. The PDCCH is transmitted by aggregation of one or more continuous control channel elements (CCEs). The CCE is a logic allocation unit used to provide the PDCCH at a coding rate based on the status of a radio channel. The CCE corresponds to a plurality of resource element groups (REGs). The format of the PDCCH and the number of available bits of the PDCCH are determined depending on the correlation between the number of CCEs and a coding rate provided by the CCE. The base station determines a PDCCH format depending on the DCI transmitted to the user equipment, and attaches cyclic redundancy check (CRC) to the control information. The CRC is masked with an identifier (for example, radio network temporary identifier (RNTI)) depending on owner or usage of the PDCCH. If the PDCCH is for a specific user equipment, the CRC may be masked with cell-RNTI (C-RNTI) of the corresponding user equipment. If the PDCCH is for a paging message, the CRC may be masked with a paging indicator identifier (P-RNTI). If the PDCCH is for system information (in more detail, system information block (SIB)), the CRC may be masked with system information identifier and system information RNTI (SI-RNTI). In order to represent a random access response which is the response to transmission of a random access preamble of the user equipment, the CRC may be masked with a random access RNTI (RA-RNTI).

Figure 5:
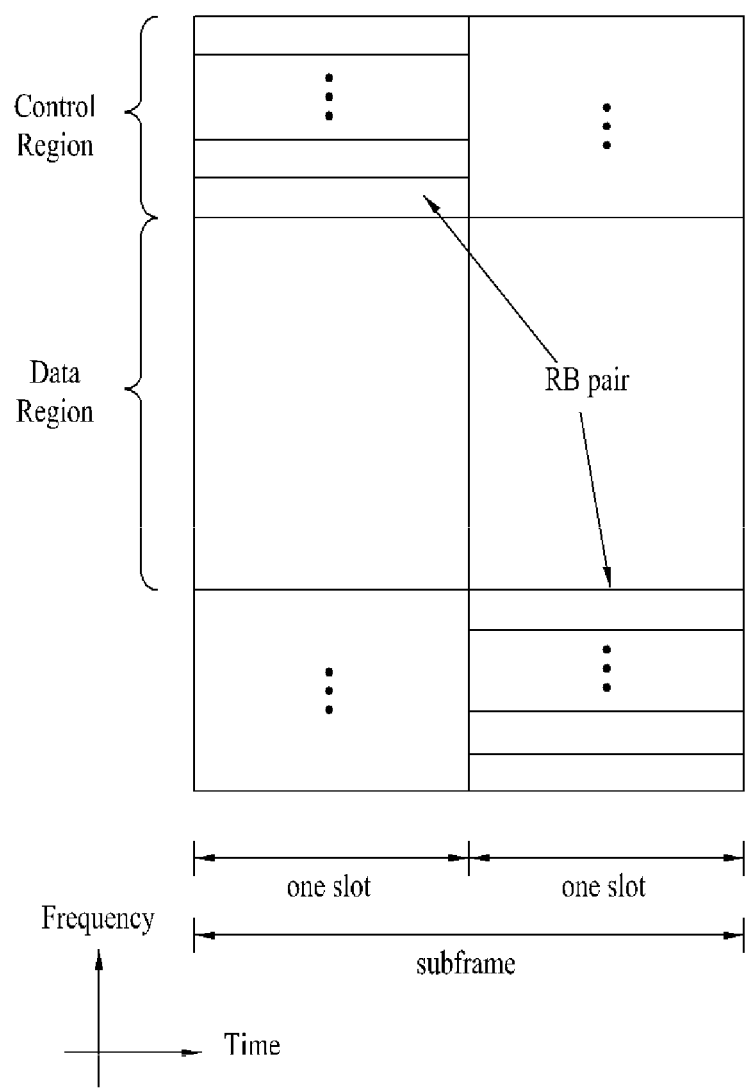
FIG. 5 is a diagram illustrating a structure of an uplink subframe.

FIG. 5 is a diagram illustrating a structure of an uplink subframe. The uplink subframe may be divided into a control region and a data region in a frequency domain. A physical uplink control channel (PUCCH) which includes uplink control information is allocated to the control region. A physical uplink shared channel (PUSCH) which includes user data is allocated to the data region. The PUCCH is used for ACK/NACK transmission in response to the PDSCH, transmission of a channel quality indicator (CQI) for frequency domain scheduling of the PDSCH, and PUSCH transmission resource request (scheduling request). CQI information bits may include one or more fields. For example, a CQI field indicating a CQI index, which determines a modulation and coding scheme (MCS), a precoding matrix indicator field indicating an index of a precoding matrix on a codebook, and a rank indicator (RI) field indicating a rank may be included in the CQI information bits.

In order to maintain single carrier properties, one user equipment does not transmit the PUCCH and the PUSCH at the same time. The PUCCH for one user equipment is allocated to a pair of RBs at the subframe. Resource blocks belonging to the pair of RBs occupy different subcarriers for two slots. This will be referred to frequency hopping of a pair of RBs allocated to the PUCCH at the boundary of the slots.

MIMO System

Figure 6:
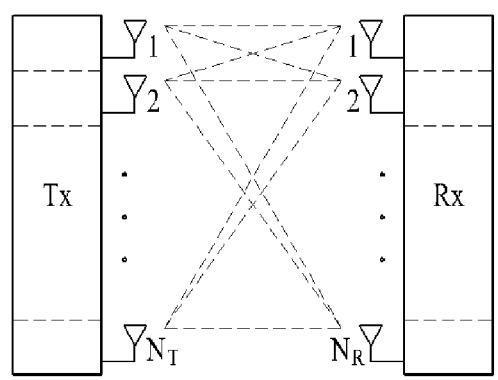
FIG. 6 is a schematic diagram illustrating a wireless communication system having multiple antennas.
Figure 6:
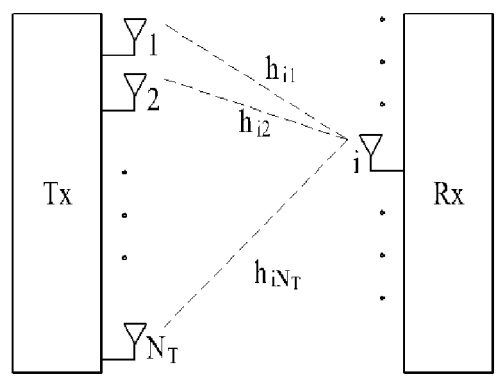

FIG. 6 is a schematic view illustrating a wireless communication system provided with multiple antennas. As shown in FIG. 6(a), if the number of transmitting antennas is increased to $N_T$ and the number of receiving antennas is increased to $N_R$, channel transmission capacity is increased theoretically in proportion to the number of antennas unlike that a plurality of antennas are used in only a transmitter or receiver. Accordingly, it is possible to improve a transmission rate and remarkably improve frequency efficiency. A transmission rate based on increase of channel transmission capacity may increase theoretically as much as a value obtained by multiplying a maximum transmission rate $R_0$, which corresponds to a case where one antenna is used, by an increase rate $R_i$, as follows.

$$R_i = \min(N_T, N_R) \qquad \text{[Equation 1]}$$

For example, in a MIMO communication system that uses four transmitting antennas and four receiving antennas, a transmission rate theoretically four times greater than that of a single antenna system may be obtained. After theoretical capacity increase of the MIMO system has been proved in the middle of 1990, various technologies have been actively studied to substantially improve a data transmission rate. Some of the technologies have been already reflected in the standard of various wireless communications such as third generation mobile communication and next generation wireless LAN.

Upon reviewing the recent trend of studies related to the MIMO system, active studies are ongoing in view of various aspects such as the study of information theoretical aspect related to MIMO communication capacity calculation under various channel environments and multiple access environments, the study of radio channel measurement and modeling of a MIMO system, and the study of time space signal processing technology for improvement of transmission reliability and transmission rate.

A communication method in a MIMO system will be described in more detail with reference to mathematical modeling. In the MIMO system, it is assumed that $N_T$ transmitting antennas and $N_R$ receiving antennas exist.

First of all, a transmitting signal will be described. If there exist $N_T$ transmitting antennas, the number of maximum transmission information is $N_T$. The transmission information may be expressed as follows.

$$s = [s_1, s_2, \ldots, s_{N_T}]^T \quad \text{[Equation 2]}$$

Different kinds of transmission power may be applied to each of the transmission information $s_1, s_2, \ldots, s_{N_T}$. At this time, supposing that each transmission power is $P_1, P_2, \ldots, P_{N_T}$, transmission information of which transmission power is controlled may be expressed as follows.

$$\hat{s} = [\hat{s}_1, \hat{s}_2, \ldots, \hat{s}_{N_T}]^T = [P_1 s_1, P_2 s_2, \ldots, P_{N_T} s_{N_T}]^T \quad \text{[Equation 3]}$$

Also, $\hat{S}$ may be expressed as follows using a diagonal matrix P.

$$\hat{s} = \begin{bmatrix} P_1 & & & 0 \\ & P_2 & & \\ & & \ddots & \\ 0 & & & P_{N_T} \end{bmatrix} \begin{bmatrix} s_1 \\ s_2 \\ \vdots \\ s_{N_T} \end{bmatrix} = Ps \quad \text{[Equation 4]}$$

It is considered that a weight matrix W is applied to the information vector $\hat{S}$ of which transmission power is controlled, so as to obtain $N_T$ transmitting signals $x_1, x_2, \ldots, x_{N_T}$. In this case, the weight matrix W serves to properly distribute the transmission information to each antenna. Such transmitting signals $x_1, x_2, \ldots, x_{N_T}$ may be expressed as follows using a vector X.

$$x = \begin{bmatrix} x_1 \\ x_2 \\ \vdots \\ x_i \\ \vdots \\ x_{N_T} \end{bmatrix} \quad \text{[Equation 5]}$$

$$= \begin{bmatrix} w_{11} & w_{12} & \cdots & w_{1N_T} \\ w_{21} & w_{22} & \cdots & w_{2N_T} \\ \vdots & & \ddots & \vdots \\ w_{i1} & w_{i2} & \cdots & w_{iN_T} \\ \vdots & & \ddots & \vdots \\ w_{N_T 1} & w_{N_T 2} & \cdots & w_{N_T N_T} \end{bmatrix} \begin{bmatrix} \hat{s}_1 \\ \hat{s}_2 \\ \vdots \\ \hat{s}_j \\ \vdots \\ \hat{s}_{N_T} \end{bmatrix}$$

$$= W\hat{s}$$

$$= WPs$$

In this case, $W_{ij}$ means a weight value between the ith transmitting antenna and the jth information. W may be referred to as a precoding matrix.

If there exist $N_R$ receiving antennas, receiving signals $y_1, y_2, \ldots, y_{N_R}$ of the respective antennas may be expressed by a vector as follows.

$$y = [y_1, y_2, \ldots, y_{N_R}]^T \quad \text{[Equation 6]}$$

In case of channel modeling in the MIMO communication system, channels may be classified depending on indexes of transmitting and receiving antennas. In this case, a channel that passes from the jth transmitting antenna to the ith receiving antenna will be expressed as $h_{ij}$. It is noted that index of the receiving antenna is prior to index of the transmitting antenna in index of $h_{ij}$.

FIG. 6(b) illustrates channels from $N_T$ transmitting antennas from the receiving antenna i. Several channels may be grouped into one and then may be expressed by a vector type or a matrix type. As shown in FIG. 6(b), the channels from $N_T$ transmitting antennas to the ith receiving antenna may be expressed as follows.

$$h_i^T = [h_{i1}, h_{i2}, \ldots, h_{iN_T}] \quad \text{[Equation 7]}$$

Accordingly, all channels from $N_T$ transmitting antennas to $N_R$ receiving antennas may be expressed as follows.

$$H = \begin{bmatrix} h_1^T \\ h_2^T \\ \vdots \\ h_i^T \\ \vdots \\ h_{N_R}^T \end{bmatrix} = \begin{bmatrix} h_{11} & h_{12} & \cdots & h_{1N_T} \\ h_{21} & h_{22} & \cdots & h_{2N_T} \\ \vdots & & \ddots & \\ h_{i1} & h_{i2} & \cdots & h_{iN_T} \\ \vdots & & \ddots & \\ h_{N_R 1} & h_{N_R 2} & \cdots & h_{N_R N_T} \end{bmatrix} \quad \text{[Equation 8]}$$

Since additive white Gaussian noise (AWGN) is actually added to the channels after the above channel matrix H. AWGN $n_1, n_2, \ldots, n_{N_R}$ added to each of the $N_R$ receiving antennas may be expressed as follows.

$$n = [n_1, n_2, \ldots, n_{N_R}]^T \quad \text{[Equation 9]}$$

The receiving signals obtained using the above equation modeling may be expressed as follows.

$$y = \begin{bmatrix} y_1 \\ y_2 \\ \vdots \\ y_i \\ \vdots \\ y_{N_R} \end{bmatrix} \quad \text{[Equation 10]}$$

$$= \begin{bmatrix} h_{11} & h_{12} & \cdots & h_{1N_T} \\ h_{21} & h_{22} & \cdots & h_{2N_T} \\ \vdots & & \ddots & \\ h_{i1} & h_{i2} & \cdots & h_{iN_T} \\ \vdots & & \ddots & \\ h_{N_R 1} & h_{N_R 2} & \cdots & h_{N_R N_T} \end{bmatrix} \begin{bmatrix} x_1 \\ x_2 \\ \vdots \\ x_j \\ \vdots \\ x_{N_T} \end{bmatrix} + \begin{bmatrix} n_1 \\ n_2 \\ \vdots \\ n_i \\ \vdots \\ n_{N_R} \end{bmatrix}$$

$$= Hx + n$$

In the meantime, the number of rows and columns of the channel matrix H indicating the channel status is determined by the number of transmitting antennas and the number of receiving antennas. The number of rows in the channel matrix H is the same as the number $N_R$ of receiving antennas, and the number of columns is the same as the number $N_T$ of transmitting antennas. In other words, the channel matrix H may be expressed by $N_R \square N_T$ matrix.

A rank of the matrix is defined by a minimum number of the number of rows and the number of columns, which are independent from each other. Therefore, the rank of the matrix cannot have a value greater than the number of rows or the number of columns. Rank (rank(H)) of the channel matrix H may be limited as follows.

$$\text{rank}(H) \leq \min(N_T, N_R) \quad \text{[Equation 11]}$$

The rank may also be defined by the number of eigen values not 0 when eigen value decomposition is performed for the matrix. Similarly, the rank may be defined by the number of singular values not 0 when singular value decomposition (SVD) is performed for the matrix. Accordingly, in the channel matrix, the rank may physically mean a maximum number of columns or rows that can transmit different kinds of information from a given channel.

In this specification, 'Rank' for MIMO transmission represents the number of paths that may independently transmit a signal from a specific frequency resource at a specific time, and 'the number of layers' represents the number of signal streams transmitted through each path. Generally, since the transmitter transmits layers corresponding to the number of ranks, the ranks are the same as the number of layers unless mentioned otherwise.

Feedback of Channel Status Information

The MIMO scheme may be divided into an open-loop system and a closed-loop system. The open-loop MIMO scheme means that a transmitter performs MIMO transmission without feedback of channel status information from a MIMO receiver. The closed-loop MIMO scheme means that the transmitter performs MIMO transmission by using channel status information fed back from the MIMO receiver. In the closed-loop MIMO scheme, each of the transmitter and the receiver may perform beamforming on the basis of the channel status information to obtain multiplexing gain of MIMO transmitting antennas. The transmitter (for example, base station) may allocate an uplink control channel or an uplink shared channel to the receiver (for example, user equipment), so that the receiver may feed the channel status information back.

The channel status information (CSI) which is fed back may include a rank indicator (RI), a precoding matrix index (PMI), and a channel quality indicator (CQI).

The RI is information for a channel rank. The rank of the channel means a maximum number of layers (or streams) that may transmit different kinds of information through the same time-frequency resources. Since the rank value is mainly determined by long term padding, it may be fed back in accordance with a longer period (that is, less frequently) than the PMI and the CQI.

The PMI is information for a precoding matrix used for transmission from the transmitter, and is a value that reflects spatial features of a channel. Precoding means that transmission layers are mapped into transmitting antennas, and layer-antenna mapping relation may be determined by a precoding matrix. The PMI corresponds to a precoding matrix index of the base station preferred by the user equipment on the basis of a metric such as a signal-to-interference plus noise ratio (SINR). In order to reduce feedback overhead of precoding information, the transmitter and the receiver previously share a codebook that includes various precoding matrixes, and only an index indicating a specific precoding matrix may be fed back from the corresponding codebook.

Figure 7:
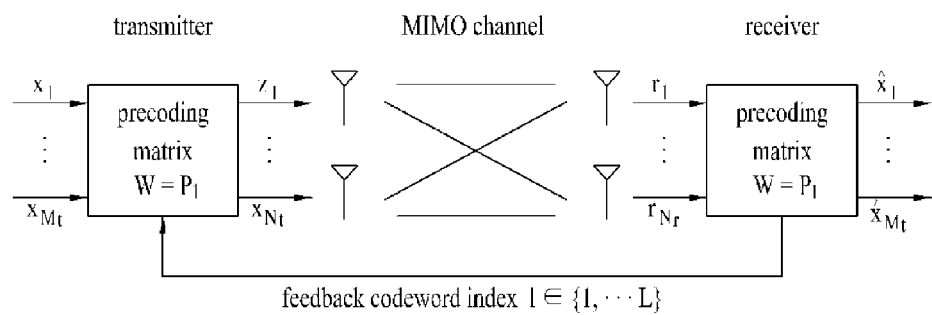
FIG. 7 is a diagram illustrating a basic concept of codebook based precoding.

A codebook based precoding scheme will be described in more detail with reference to FIG. 7. According to the codebook based precoding scheme, the transmitter and the receiver shares codebook information that includes a predetermined number of precoding matrixes which are previously determined in accordance with a transmission rank, the number of antennas, etc. In other words, if feedback information is finite, the precoding based codebook scheme may be used. In this case, precoding matrixes included in the codebook may previously be determined by precoding matrixes obtained by quantization of the channel status. If more detailed quantization is applied to the channel status, the precoding matrix, which reflects the actual channel status more exactly, may be determined. If the size of the codebook becomes too great, since feedback overhead is increased, a codebook of a proper size may be designed.

The receiver may measure the channel status through a received signal and feed information on infinite number of preferred precoding matrixes (that is, indexes of corresponding precoding matrixes) back to the transmitter on the basis of the aforementioned codebook information. For example, the receiver may select an optimized precoding matrix by measuring the received signal in accordance with a maximum likelihood (ML) scheme or a minimum mean square error (MMSE) scheme. Although FIG. 7 illustrates that the receiver transmits precoding matrix information per codeword to the transmitter, the present invention is not limited to the example of FIG. 7.

The transmitter that has received feedback information from the receiver may select a specific precoding matrix from the codebook on the basis of the received information. In this case, the transmitter may select a precoding matrix, which will be applied to MIMO transmission, by considering the precoding matrix indexes fed back from the receiver. In this case, the precoding information fed back from the receiver is precoding information preferred by the receiver, and it is not essentially required that the transmitter should use a precoding matrix indicated by the precoding matrix index fed back from the receiver. Namely, the transmitter may select a proper precoding matrix. The transmitter that has selected the precoding matrix may perform precoding in such a way to multiply layer signals equivalent to transmission ranks by the selected precoding matrix, and may transmit the precoded signals through a plurality of antennas. The transmitter may notify the receiver what precoding information applied to the transmitting signals is.

The receiver that has received the signal precoded by and transmitted from the transmitter may perform inverse processing of precoding performed by the transmitter and recover the received signals. Generally, since the precoding matrix satisfies a unitary matrix (U) such as $U*U^H=I$, the inverse processing of precoding may be performed in such a manner that a hermit matrix $P^H$ of the precoding matrix P used for precoding of the transmitter is multiplied by the received signals.

The CQI is the information indicating channel quality or channel strength. The CQI may be expressed by MCS combination which is previously determined. In other words, the CQI index represents a corresponding modulation scheme and a code rate. Generally, the CQI becomes a value that reflects received SINR that may be obtained if the base station configures a spatial channel by using the PMI.

In respect of CQI measurement, the user equipment may calculate a channel status or an effective signal-to-interference plus noise ratio (SINR) by using a reference signal. Also, the channel status or the effective SINR may be measured on a full system bandwidth (may be referred to as set S), or may be measured on a partial bandwidth (specific subband or specific RB). CQI for the full system bandwidth (set S) may be referred to as wideband (WB) CQI, and CQI for the partial band may be referred to as subband (SB) CQI. The user equipment may obtain the highest MCS on the basis of the calculated channel status or the calculated effective SINR. The highest MCS means the MCS of which transmission block error rate does not exceed 10% during decoding and which satisfies the assumption on CQI calculation. The user equipment may determine CQI index related to the obtained MCS and report the determined CQI index to the base station.

Also, reporting of the channel information may be divided into periodic reporting which is performed periodically and aperiodic reporting which is performed by a request of the base station.

Aperiodic reporting is set for each user equipment by a 1 bit request bit (CQI request bit) included in uplink scheduling information sent from the base station to the user equipment.

If aperiodic reporting information is received, the user equipment may forward channel information considering its transmission mode to the base station through the PUSCH. It may be set such that the RI and CQI/PMI may not be transmitted on the same PUSCH.

In case of periodic reporting, a period of channel information transmitted through an upper layer and offset for the corresponding period may be signaled to each user equipment in a unit of subframe, and channel information considering the transmission mode of each user equipment may be forwarded to the base station through the PUCCH in accordance with a given period. If data transmitted through an uplink exist at the subframe to which the channel information is transmitted in accordance with the given period, the corresponding channel information may be transmitted through the PUSCH not the PUCCH together with the data. In case of periodic reporting through the PUCCH, a bit more restricted than that of the PUSCH may be used. The RI and CQI/PMI may be transmitted on the same PUSCH. If periodic reporting and aperiodic reporting collide with each other within the same subframe, aperiodic reporting may only be performed.

Codebook Design

In the system (for example, LTE-A system) that supports extended antenna configuration, it is considered that additional multi-user diversity is acquired using a multi-user-MIMO (MU-MIMO) scheme. In case of the MU-MIMO scheme, since an interference channel exists between the user equipments multiplexed in an antenna domain, if the base station performs downlink transmission by using channel status information fed back from one of multiple user equipments, it is required that interference should not occur with the other user equipments. Accordingly, in order that MU-MIMO operation is performed normally, channel status information having exactness higher than that of the SU-MIMO scheme should be fed back.

A new CSI feedback method improved from CSI, which includes the existing RI, PMI and CQI, may be used such that the channel status information may be measured and reported more exactly. For example, the precoding information fed back from the receiver may be indicated by combination of two PMIs. One (first PMI) of the two PMIs has attributes of long term and/or wideband and may be referred to as W1. The other one (second PMI) of the two PMIs has attributes of short term and/or subband and may be referred to as W2. Final PMI may be determined by combination (or function) of W1 and W2. For example, if the final PMI is W, W=W1*W2 or W=W2*W1 may be defined.

In this case, W1 reflects average features on frequency and/or time of a channel. In other words, W1 may be defined as channel status information that reflects features of long term channel on the time or features of wideband channel on the frequency, or reflects features of long term channel on the time and features of wideband channel on the frequency. In order to briefly express the features of W1, in this specification, W1 will be referred to as channel status information (or long term-wideband PMI) of long term-wideband attributes.

In the meantime, W2 reflects relatively instantaneous channel features as compared with W1. In other words, W2 may be defined channel status information that reflects features of short term channel on the time or features of subband channel on the frequency, or reflects features of short term channel on the time and features of subband channel on the frequency. In order to briefly express the features of W2, in this specification, W2 will be referred to as channel status information (or short term-subband PMI) of short term-subband attributes.

In order to determine a final precoding matrix W from information (for example, W1 and W2) of two different attributes indicating the channel status, it is required to configure separate codebooks (that is, first codebook for W1 and second codebook for W2) configured by precoding matrixes indicating channel information of each attribute. The codebooks configured as above may be referred to as hierarchical codebooks. Also, if the codebook which will finally be used is determined using the hierarchical codebooks, it may be referred to as hierarchical codebook transformation.

As an example of hierarchical codebook transformation, a codebook may be transformed using a long term covariance matrix of a channel as expressed by the following Equation 12.

$$W1 = R$$

$$W = \mathrm{norm}(W1\,W2) \quad \text{[Equation 12]}$$

In the Equation 12, W1 (long term-wideband PMI) represents an element (that is, codeword) that constitutes a codebook (for example, first codebook) made to reflect channel information of long term-wideband attributes. In other words, W1 corresponds to a precoding matrix included in the first codebook that reflects channel information of long term-wideband attributes. In the meantime, W2 (short term-subband PMI) represents a codeword that constitutes a codebook (for example, second codebook) made to reflect channel information of short term-subband attributes. In other words, W2 corresponds to a precoding matrix included in the second codebook that reflects channel information of short term-subband attributes. W represents a codeword of the transformed final codebook. norm(A) means a matrix in which norm for each column of a matrix A is normalized to 1. In the Equation 12, it is assumed that W1 is expressed as R which is a long term covariance matrix of a channel H, and R may be expressed as follows.

$$R = E[H^H H] \overset{(a)}{=} V \Lambda V^H = \sum_{i=1}^{Nt} \sigma_i v_i v_i^H \quad \text{[Equation 13]}$$

In the Equation 13, $\overset{(a)}{=}$ represents that the result obtained by singular value decomposition of $E[H^H H]$ is $V \Lambda V^H$. Also, $\sigma_i$ and $v_i$ means the ith singular value and the ith singular column vector corresponding to the ith singular value, respectively, wherein $\sigma_1 \geq \sigma_2 \geq \ldots \geq \sigma_{Nt}$.

For example, if the number of transmitting streams is 1, W2 is a vector of Nt×1 size, and W may be expressed as follows.

$$W = \sum_{i=1}^{Nt} \sigma_i v_i (v_i^H W2) \quad \text{[Equation 14]}$$

In the Equation 14, W is determined by weighted linear combination of the singular vectors. In this case, a weighted factor of $v_i$ is determined by multiplication of the singular value $\sigma_i$ by $v_i^H W2$ which is a correlation between $v_i$ and a codeword W2. As a result, distribution of codewords of the codebook configured by W is more concentrated on a dominant singular vector having a greater value of $\sigma_i$, more effective quantization may be performed.

Figure 8:
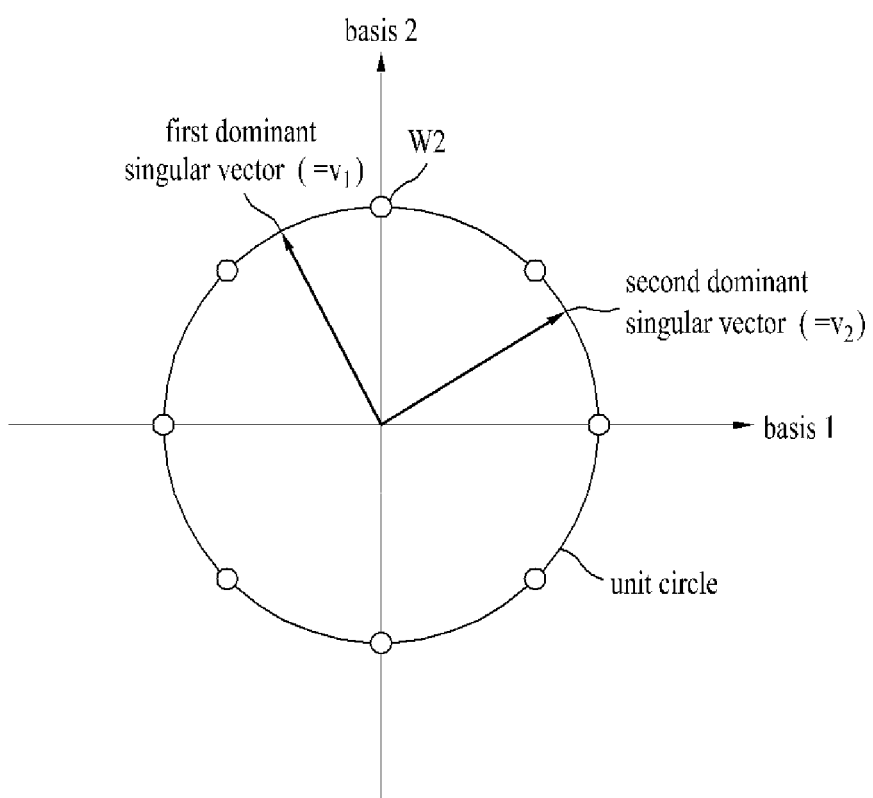
FIG. 8 is a diagram illustrating that one codebook is used.
Figure 9:
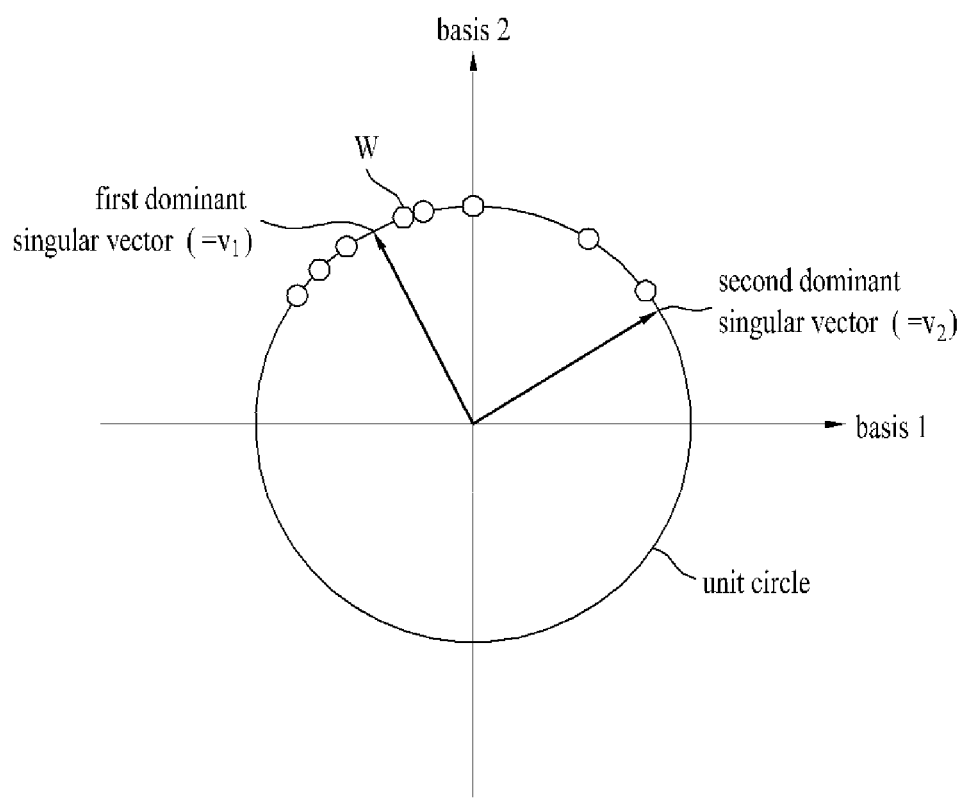
FIG. 9 is a diagram illustrating that a codebook determined by hierarchal codebook transformation based on two codebooks is used.

FIG. 8 and FIG. 9 are diagrams illustrating that a channel status may be reflected in case of hierarchal codebook transformation. In FIG. 8 and FIG. 9, it is assumed that Nt=2 (that is, it is assumed that the number of transmitting antennas is 2 (2Tx)) is defined to represent a two-dimensional space. However, the example of FIG. 8 and FIG. 9 are only illustrated for convenience of description, and the present invention is not limited to the example of FIG. 8 and FIG. 9. It is assumed that the two-dimensional space is configured by basis 1 and basis 2. FIG. 8 illustrates that one codebook (that is, codebook W2) is only used, and FIG. 9 illustrates that a codebook (that is, W) determined by hierarchal codebook transformation based on two codebooks (that is, codebook W1 and codebook W2) is used.

In FIG. 8, singular vectors (first dominant singular vector and a second dominant singular vector) and W2 (that is, codewords of codebook W2) exist on the two-dimensional space. The first dominant singular vector means a singular vector having a weighted value greater than the second dominant singular vector. Although the codewords W2 may be distributed unlike the example of FIG. 8, it is generally assumed in FIG. 8 that the codewords W2 are distributed to maximize (that is, uniformly) the minimum distance between two codewords W2 within the Grassmannian space where a channel exists. Accordingly, among the codewords W2 that may be expressed by sum of the first singular vector and the second singular vector, the codeword W2 (W2 located on the basis 1 of FIG. 8) closer to the first dominant singular vector may be determined. If the codebook designed as above is used, although good throughput may be obtained from an uncorrelated channel, throughput may be deteriorated in a correlated channel. Moreover, since correlation between the singular vector of an instantaneous channel H and the singular vector of R is high in the correlated channel, it is more effective that the codebook is adaptively transformed in accordance with R by using this correlation.

In FIG. 9, singular vectors (first dominant singular vector and a second dominant singular vector) and W (that is, codewords generated by codebook transformation based on codebooks W1 and W2) exist on the two-dimensional space. As shown in FIG. 9, if codebook transformation is used, a greater weighted value may be applied to the first dominant singular vector of R as described above, whereby new codewords may be distributed more compactly on the basis of the first dominant singular vector. In other words, the codewords may be selected to reflect the actual channel status more exactly.

When the hierarchal codebook based on W1 and W2 is configured as described above, it is required to determine a codebook structure of each of W1 and W2. In the present invention, this codebook structure will be suggested, and various examples of a codebook based on this codebook structure will be described in detail. First of all, functions of W1 and W2 suggested in the present invention will be described, and description of examples of each codebook will follow.

Embodiment 1

In case of features of radio channels on a time axis, instantaneous channels have small variance on the basis of a long term channel average. Likewise, a channel of a specific subband on a frequency axis has small variance on the basis of a wideband channel average. The basis reason why the channel codebook is divided into W1 and W2 is to achieve high exactness while reducing feedback overhead by using statistical characteristics of the channel. Accordingly, the present invention suggests that W1 is designed to express a vector group close to a dominant channel direction of long term-wideband attributes and W2 is configured by a coefficient value for expressing an instantaneous channel through linear combination of vectors included in W1.

Figure 10:
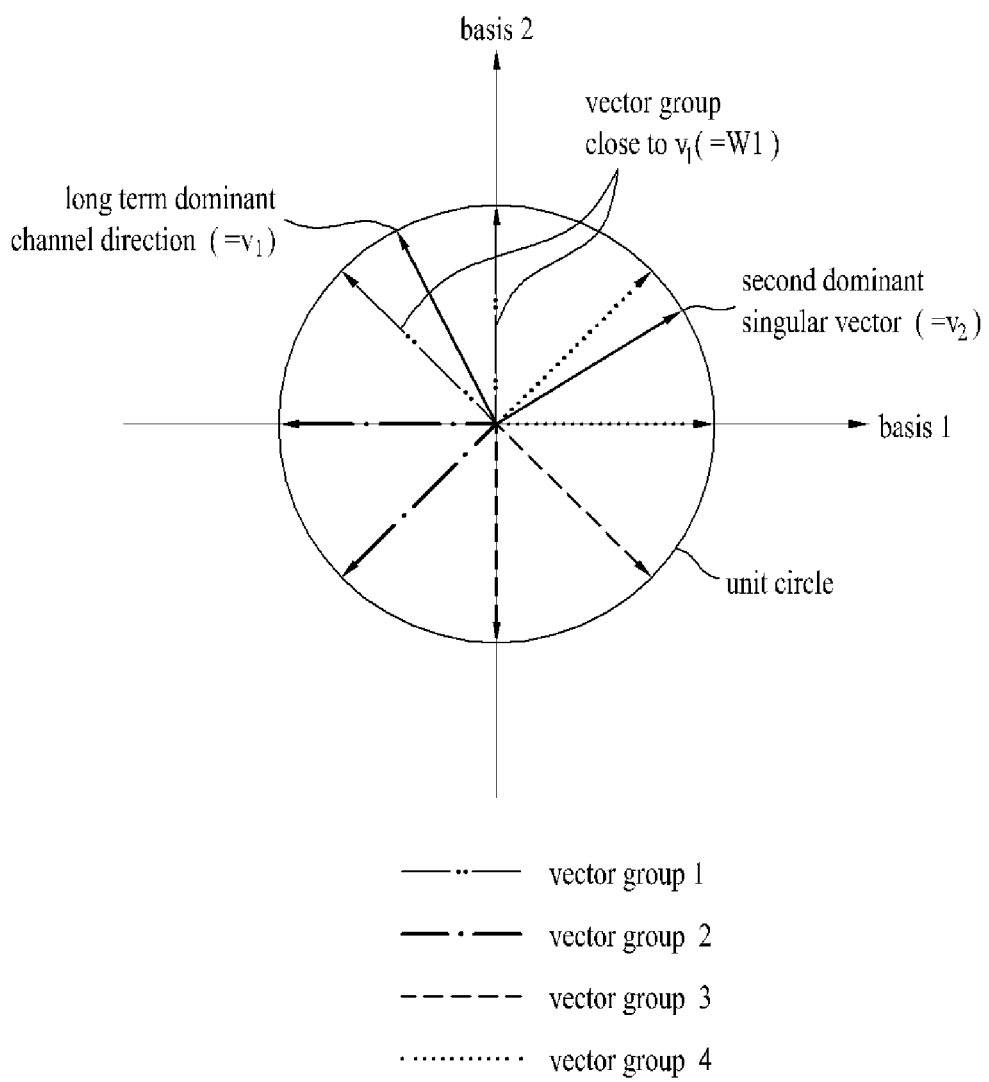
FIG. 10 is a diagram illustrating an example of W1 codewords that may be applied to codebook transformation.

FIG. 10 is a diagram illustrating an example of W1 codewords that may be applied to codebook transformation. In FIG. 10, it is assumed that the number of transmitting antennas is 2, and a direction of a long term dominant channel on the two-dimensional space and its quantized W1 (that is, vector group) are illustrated. All the codewords (that is, all the vector groups) of W1 may be configured to uniformly perform sampling for the entire vector space corresponding to the number of transmitting antennas. The vectors constituting each of the vector groups of W1 may be configured by values having great correlation values. Although FIG. 10 illustrates that the number of transmitting antennas is 2 (2Tx), W1 may be generated in accordance with the same principle even if the number of transmitting antennas is 4 (4Tx).

Figure 11:
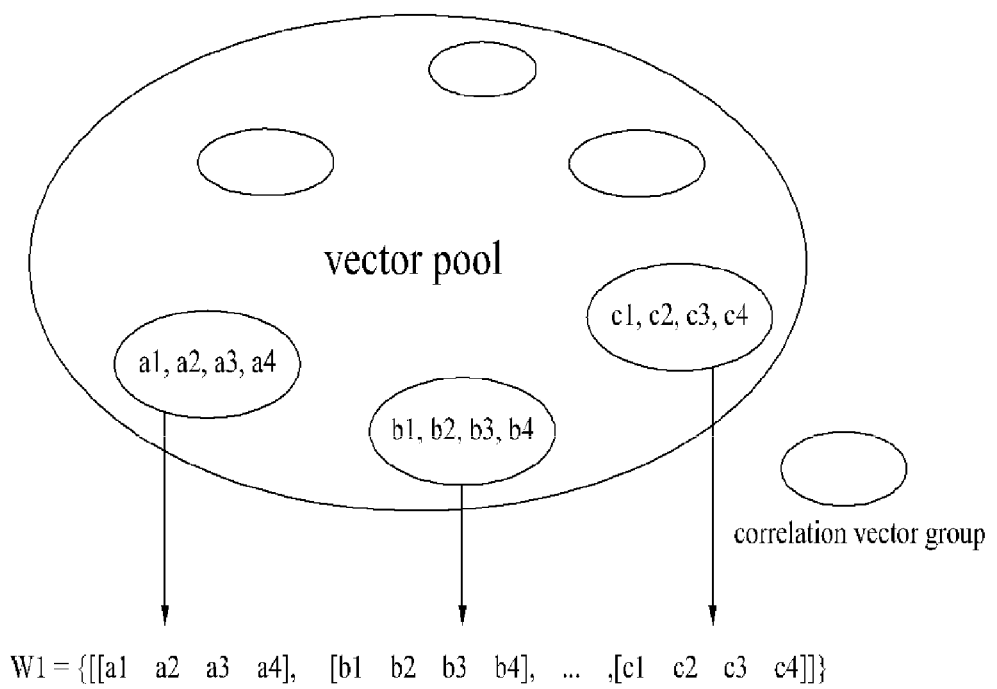
FIG. 11 is a conceptional diagram illustrating a configuration of W1 codewords when the number of transmitting antennas is 4.

FIG. 11 is a conceptional diagram illustrating a configuration of W1 codewords when the number of transmitting antennas is 4. As shown in FIG. 11, a plurality of vector groups may be generated from a full vector pool, and each of the vector groups is configured by vectors of high correlation. The codebook W1 may be designed to include some or all of the vector groups of the full vector pool. For example, as illustrated in the example of FIG. 11, it is assumed that {a1, a2, a3, a4} configures a vector group 1, {b1, b2, b3, b4} configures a vector group 2, {c1, c2, c3, c4} configures a vector group 3, and the other vector groups exist. For example, the codebook W1 may be configured to include the vector groups 1, 2 and 3.

Since it is likely that the instantaneous channel exists near $v_1$ which is the long term dominant channel direction, the instantaneous channel may be expressed effectively by linear combination of the vectors that configures the vector groups of W1. Accordingly, the final codebook W may be calculated as expressed by the following Equation 15.

$$W = \mathrm{norm}(W1\,W2) \qquad \text{[Equation 15]}$$

Also, the vector pool of FIG. 11 may be configured by various values. For example, W1 for four transmitting antennas may be configured by 4Tx codebook for spatial multiplexing defined in the LTE release-8 system. The 4Tx codebook defined in the LTE release-8 system is as follows.

TABLE 1

Table 6.3.4.2.3-2: Codebook for transmission on antenna ports {0,1,2,3}.

| Codebook Index | $u_n$ | Number of layers u | | | |
|---|---|---|---|---|---|
| | | 1 | 2 | 3 | 4 |
| 0 | $u_0 = [1\ -1\ -1\ -1]^T$ | $W_0^{\{1\}}$ | $W_0^{\{14\}}/\sqrt{2}$ | $W_0^{\{124\}}/\sqrt{3}$ | $W_0^{\{1234\}}/2$ |
| 1 | $u_1 = [1\ -j\ 1\ j]^T$ | $W_1^{\{1\}}$ | $W_1^{\{12\}}/\sqrt{2}$ | $W_1^{\{123\}}/\sqrt{3}$ | $W_1^{\{1234\}}/2$ |
| 2 | $u_2 = [1\ 1\ -1\ 1]^T$ | $W_2^{\{1\}}$ | $W_2^{\{12\}}/\sqrt{2}$ | $W_2^{\{123\}}/\sqrt{3}$ | $W_2^{\{3214\}}/2$ |
| 3 | $u_3 = [1\ j\ 1\ -j]^T$ | $W_3^{\{1\}}$ | $W_3^{\{12\}}/\sqrt{2}$ | $W_3^{\{123\}}/\sqrt{3}$ | $W_3^{\{3214\}}/2$ |

TABLE 1-continued

Table 6.3.4.2.3-2: Codebook for transmission on antenna ports{0,1,2,3}.

| Codebook Index | $u_n$ | Number of layers u | | | |
|---|---|---|---|---|---|
| | | 1 | 2 | 3 | 4 |
| 4 | $u_4 = [1\ (-1-j)/\sqrt{2}\ -j\ (1-j)/\sqrt{2}]^T$ | $W_4^{\{1\}}$ | $W_4^{\{14\}}/\sqrt{2}$ | $W_4^{\{124\}}/\sqrt{3}$ | $W_4^{\{1234\}}/2$ |
| 5 | $u_5 = [1\ (1-j)/\sqrt{2}\ j\ (-1-j)/\sqrt{2}]^T$ | $W_5^{\{1\}}$ | $W_5^{\{14\}}/\sqrt{2}$ | $W_5^{\{124\}}/\sqrt{3}$ | $W_5^{\{1234\}}/2$ |
| 6 | $u_6 = [1\ (1+j)/\sqrt{2}\ -j\ (-1+j)/\sqrt{2}]^T$ | $W_6^{\{1\}}$ | $W_6^{\{13\}}/\sqrt{2}$ | $W_6^{\{134\}}/\sqrt{3}$ | $W_6^{\{1324\}}/2$ |
| 7 | $u_7 = [1\ (-1+j)/\sqrt{2}\ j\ (1+j)/\sqrt{2}]^T$ | $W_7^{\{1\}}$ | $W_7^{\{13\}}/\sqrt{2}$ | $W_7^{\{134\}}/\sqrt{3}$ | $W_7^{\{1324\}}/2$ |
| 8 | $u_8 = [1\ -1\ 1\ 1]^T$ | $W_8^{\{1\}}$ | $W_8^{\{12\}}/\sqrt{2}$ | $W_8^{\{124\}}/\sqrt{3}$ | $W_8^{\{1234\}}/2$ |
| 9 | $u_9 = [1\ -j\ -1\ -j]^T$ | $W_9^{\{1\}}$ | $W_9^{\{14\}}/\sqrt{2}$ | $W_9^{\{134\}}/\sqrt{3}$ | $W_9^{\{1234\}}/2$ |
| 10 | $u_{10} = [1\ 1\ 1\ -1]^T$ | $W_{10}^{\{1\}}$ | $W_{10}^{\{13\}}/\sqrt{2}$ | $W_{10}^{\{123\}}/\sqrt{3}$ | $W_{10}^{\{1324\}}/2$ |
| 11 | $u_{11} = [1\ j\ -1\ j]^T$ | $W_{11}^{\{1\}}$ | $W_{11}^{\{13\}}/\sqrt{2}$ | $W_{11}^{\{134\}}/\sqrt{3}$ | $W_{11}^{\{1324\}}/2$ |
| 12 | $u_{12} = [1\ -1\ -1\ 1]^T$ | $W_{12}^{\{1\}}$ | $W_{12}^{\{12\}}/\sqrt{2}$ | $W_{12}^{\{123\}}/\sqrt{3}$ | $W_{12}^{\{1234\}}/2$ |
| 13 | $u_{13} = [1\ -1\ 1\ -1]^T$ | $W_{13}^{\{1\}}$ | $W_{13}^{\{13\}}/\sqrt{2}$ | $W_{13}^{\{123\}}/\sqrt{3}$ | $W_{13}^{\{1324\}}/2$ |
| 14 | $u_{14} = [1\ 1\ -1\ -1]^T$ | $W_{14}^{\{1\}}$ | $W_{14}^{\{13\}}/\sqrt{2}$ | $W_{14}^{\{123\}}/\sqrt{3}$ | $W_{14}^{\{3214\}}/2$ |
| 15 | $u_{15} = [1\ 1\ 1\ 1]^T$ | $W_{15}^{\{1\}}$ | $W_{15}^{\{12\}}/\sqrt{2}$ | $W_{15}^{\{123\}}/\sqrt{3}$ | $W_{15}^{\{1234\}}/2$ |

In the LTE release-8 system, it is defined that a precoding matrix W is selected from Table 1 or a subset of Table 1 with respect to transmission on four transmitting antennas (antenna port indexes 0, 1, 2 and 3). In Table 1, $W_n^{\{s\}}$ represents a matrix defined by columns given by a set $\{s\}$. For example, $W_n^{\{ab\}}$ may be configured by the ath column and the bth column of $W_n$. Also, $W_n = I - 2u_n u_n^H / u_n^H u_n$, wherein I is a 4×4 identity matrix and the vector $u_n$ is given by Table 1.

The codebook W1 according to the present invention may be configured on the basis of the codebook as illustrated in Table 1. For example, the codebook W1 may be configured in such a manner that four codewords of high correlation are selected from the codebook of rank 1 (number of layers=1) of the codebooks of Table 1 and set to one vector group. For another example, the codebook W1 may be configured in such a manner that a vector pool is configured by all the codewords, which configure a codebook of rank 4 (number of layers=4) of the codebooks of Table 1 and four vector groups of high correlation are selected from the vector pool.

Alternatively, an oversampled discrete fourier transform (DFT) matrix may be added to the vector pool that include various codewords as above. The oversampled DFT matrix may be expressed as follows.

$[e^{j0(2\pi k)/8} e^{j1(2\pi k)/8} e^{j2(2\pi k)/8} e^{j3(2\pi k)/8}]^T$,
where k is 0 to 7.

$[e^{j0(2\pi k)/16} e^{j1(2\pi k)/16} e^{j2(2\pi k)/16} e^{j3(2\pi k)/16}]^T$, where k is 0 to 15.

Next, if the codebook W1 for rank 2 is configured, four vectors that configure the codeword W1 may be divided into two groups, whereby the two groups are orthogonal to each other, if possible, and the vectors in each group may be configured to have high correlation with one another. This is because that a long term channel direction is expressed by two orthogonal vectors (that is, first dominant singular vector and second dominant singular vector) in case of rank 2. Accordingly, in case of rank 2 unlike rank 1, two of four vectors that configure W1 may be used to express the first dominant singular vector, and the other two vectors may be used to express the second dominant singular vector. For example, supposing that four vectors configuring the codeword W1 are {a1, a2, a3, a4}, the vectors may be configured in such a manner that [a1, a2] is orthogonal to [a3, a4], a1 and a2 have high correlation, and a3 and a4 have high correlation.

If W1 is configured as above, W2 may be configured as follows.

W2 means complex coefficient values used when the instantaneous channel is represented by linear combination of the vectors of W1. For example, in case of transmission of 4Tx and rank 1, W2 may be configured by combination of four sets (that is, sets A, B, C and D) of the following Equation 17.

$$A = \left\{ [1\ e^{j\theta_1}\ e^{j\theta_2}\ e^{j\theta_3}]^T \right|$$ [Equation 17]

$$\theta_i \in \left\{0, \frac{2\pi}{N}, \frac{4\pi}{N}, \ldots, \frac{2\pi(N-1)}{N}\right\}\right\}$$

$$B = \{[\alpha_0\ \alpha_1\ \alpha_2\ \alpha_3]^T\ |\ \alpha_i \in \{\varepsilon, 1\}\}$$

$$C = \left\{[\alpha_0\ \alpha_1 e^{j\theta_1}\ \alpha_2 e^{j\theta_2}\ \alpha_3 e^{j\theta_3}]^T\right|$$

$$\theta_i \in \left\{0, \frac{2\pi}{N}, \frac{4\pi}{N}, \ldots, \frac{2\pi(N-1)}{N}\right\}, \alpha_i \in \{\varepsilon, 1\}\right\}$$

$$D = \{[1\ 0\ 0\ 0]^T, [0\ 1\ 0\ 0]^T,$$

$$[0\ 0\ 1\ 0]^T, [0\ 0\ 0\ 1]^T\}$$

In the Equation 17, A is a coefficient set configured by phase rotation components only. B is a coefficient set configured by 1 or a very small value ($\varepsilon$). C is a coefficient set to which phase rotation and magnitude modification are applied. D is a coefficient set that may configure the final W by selecting one of columns configuring W1.

In case of the aforementioned 4Tx, W2 for Nt transmitting antennas may be configured in accordance with the same principle as that of the method for configuring W2.

Also, W2 may be defined by different sizes in accordance with rank. If a rank value r and the number Nt of antennas are given, W2 may be defined as Nt×r sized matrix (or vector). In the meantime, W1 may be defined as a matrix of Nt×Nt size regardless of rank. Accordingly, although the method for configuring W2 in case of rank 2 has been described as above, W2 may be configured in accordance with the same principle even in case of rank 2 or more.

Embodiment 2

In the aforementioned Embodiment 1, W1 is determined from the codebook having a plurality of codewords and W2 is configured as a coefficient for linear combination of the vectors of W1.

This Embodiment 2 relates to a method for configuring W2 when the codebook W2 is configured by one codeword only. In this case, one codeword configuring W1 may include entire vector pools. W1 has a size of Nt×M (in this case, M>>Nt), and may have a type of a matrix (briefly referred to as a fat matrix) having the number of columns greater than the number of rows. Also, since W1 is fixed by one codeword only, it is not required that information for W1 should be fed back. Accordingly, since the MIMO transmitter and the MIMO receiver may transmit and receive W2 only to and from each other as precoding information, it is advantageous in that control signal overhead is reduced.

The vector pool constituting W1 may be configured by one of codewords of 4Tx and rank 1 defined in the LTE release-8 system, codewords of 4Tx and rank 4 define din the LTE release-8 system, and DFT matrixes of Nt×M size, or may be configured by combination of one or more of the above codewords and DFT matrixes.

W2 may be configured by one of the sets A, B, C and D of the Equation 17, or may be configured by combination of one or more of the sets.

For example, if W1 is configured by the codewords (codewords of number of layers=1 in Table 1) of 4Tx and rank 1 defined in the LTE release-8 system and W2 is designed in the same manner as the set D (that is, one column is selected from W1) of the Equation 17, W, W1 and W2 may be expressed as follows.

[Equation 18]

$$W = norm(W1 W2)$$

$$W1 = \left\{ \begin{bmatrix} 1 & 1 & 1 & 1 & 1 & 1 & 1 & 1 & 1 & 1 & 1 & 1 & 1 & 1 & 1 & 1 \\ 1 & -1 & 1 & -1 & 1 & 1 & -1 & -1 & -j & j & -j & j & \frac{1-j}{\sqrt{2}} & \frac{1+j}{\sqrt{2}} & \frac{-1-j}{\sqrt{2}} & \frac{-1+j}{\sqrt{2}} \\ 1 & 1 & -1 & -1 & 1 & -1 & 1 & -1 & -1 & -1 & 1 & 1 & -j & j & j & -j \\ 1 & -1 & -1 & 1 & -1 & 1 & 1 & -1 & j & -j & -j & j & \frac{-1-j}{\sqrt{2}} & \frac{-1+j}{\sqrt{2}} & \frac{1-j}{\sqrt{2}} & \frac{1+j}{\sqrt{2}} \end{bmatrix} \right\}$$

$$W2 = \{e_{16}^1, e_{16}^2, \ldots, e_{16}^{16}\}$$

In the Equation 18, $e_j^i$ is a vector of j×1 size, the ith component of j vector components is 1, and the other components represent a vector of 0. If $e_j^i$ is multiplied by W1, since the ith column is selected from the columns of W1, this vector may be referred to as a selection vector.

The Equation 18 illustrates examples of W1 and W2 for 4Tx rank 1, and the codebook may be designed in accordance with the same principle even in case of rank more than 2. In other words, W1 may be configured as a fat matrix that includes all the codewords for a corresponding rank, and W2 may be defined as vector(s) which may select some codewords of W1. For example, in order to configure the codebook for rank 2, the fat matrix configured by all the column vectors of codewords (for example, codewords of number of layers=2 in Table 1) of rank 2 may be defined as W1, and W2 may be defined by combination of $\{[e_{32}^i \; e_{32}^j], i \approx j\}$. In other words, W2 may be defined as vectors that may select two columns from W1 which is a set of codewords of rank 2.

For another example, W1 defined as one fat matrix may be configured to include all the column vectors existing in a vector pool 1 or vector pool 2 of the following Equation 19.

[Equation 19]

vector pool 1 = $\{\Theta_i W_{1j} | i = 1, \ldots, 8, j = 1, \ldots, 16\}$, vector pool 2 = $\{\Theta_i W_{1j} | i = 1, \ldots, 4, j = 1, \ldots, 16\}$, -continued where $\Theta_1 = \text{diag}\{1, e^{j\frac{\pi}{32}}, e^{j\frac{2\pi}{32}}, e^{j\frac{3\pi}{32}}\}$, $\Theta_2 = \text{diag}\{1, e^{j\frac{-\pi}{32}}, e^{j\frac{-2\pi}{32}}, e^{j\frac{-3\pi}{32}}\}$, $\Theta_3 = \text{diag}\{1, e^{j\frac{3\pi}{32}}, e^{j\frac{6\pi}{32}}, e^{j\frac{9\pi}{32}}\}$, $\Theta_4 = \text{diag}\{1, e^{j\frac{-3\pi}{32}}, e^{j\frac{-6\pi}{32}}, e^{j\frac{-9\pi}{32}}\}$, $\Theta_5 = \text{diag}\{1, 1, 1, 1\}, \Theta_6 = \text{diag}\{1, 1, -1, -1\}$, $\Theta_7 = \text{diag}\{1, 1, j, j\}, \Theta_8 = \text{diag}\{1, 1, -j, -j\}$ In the Equation 19, $W_{ij}$ means the jth codeword when a rank is 1 in the 4Tx codebook defined in the LTE release-8 system as illustrated in Table 1. diag{a,b,c,d} means that diagonal components in a diagonal matrix are a, b, c, and d in due order. In the Equation 19, $\Theta_1, \Theta_2, \Theta_3, \Theta_4$ serve to multiply phase components increased linearly, and if this precoding matrix is applied, beam intervals may be configured compactly. Also, in the Equation 19, $\Theta_5, \Theta_6, \Theta_7, \Theta_8$ serve to multiply phase components to be easily applied to ULA (Uniform Linear Array) configuration or cross-pole or X-pol antenna configuration.

In the Equation 19, if W1 is configured by vector pool 1, W2 may be configured as a selection vector as expressed by the following Equation 20.

$W2=\{e_{96}^i|i=1,\ldots,96\}$ [Equation 20]

In the Equation 19, if W1 is configured by vector pool 2, W2 may be configured as a selection vector as expressed by the following Equation 21.

$W2=\{e_{64}^i|i=1,\ldots,64\}$ [Equation 21]

Although the rank 1 codebook design has been exemplarily described in respect of the Equations 19 to 21, the codebooks of W1 and W2 may be designed in accordance with the same principle in case of rank more than 2. For example, in case of rank 2, in the Equation 19, $W_{1j}$ may be replaced with $W_{2j}$ (in this case, $W_{2j}$ means the jth codeword when rank is 2 (number of layers=2) in the 4Tx codebook defined in the LTE release-8 system as illustrated in Table 1), and in the Equations 20 and 21, the codeword $e_M^i$ of W2 may be replaced with $[e_{2M}^{2i-1} \; e_{2M}^{2i}]$, whereby the codebooks of W1 and W2 may be generated.

Embodiment 3

In the aforementioned Embodiment 2, W1 has been defined as one fat matrix. In this Embodiment 3, W1 may be configured to include a predetermined number of vector groups, and W2 may be configured as a vector that selects a specific column vector from one vector group. In this case, precoding information transmitted and received between the MIMO transmitter and the MIMO receiver may be index W1 as to what vector group is selected from the codebook W1 and index W2 as to what column vector is selected from the selected vector group.

For example, sixteen vector groups may be set from the vector pool 1 of the Equation 19 as expressed by the following Equation 22, whereby the codebook of W1 may be configured. Also, a specific column vector may be selected by W2 within one vector group of the codebook of W1.

$$W1=\{[\Theta_1 W_{1j} \Theta_2 W_{1j} \Theta_3 W_{1j} \Theta_4 W_{1j} \Theta_5 W_{1j} \Theta_6 W_{1j} \Theta_7 W_{1j} \Theta_8 W_{1j}]|j=1,\ldots,16\},$$

$$W2=\{e_8{}^i|i=1,\ldots,8\} \quad \text{[Equation 22]}$$

For another example, sixteen vector groups may be set from the vector pool 2 of the Equation 19 as expressed by the following Equation 23, whereby the codebook of W1 may be configured. Also, a specific column vector may be selected by W2 within one vector group of the codebook of W1.

$$W1=\{[\Theta_1 W_{1j} \Theta_2 W_{1j} \Theta_3 W_{1j} \Theta_4 W_{1j}]|j=1,\ldots,16\},$$

$$W2=\{e_4{}^i|i=1,\ldots,4\} \quad \text{[Equation 23]}$$

Although the rank 1 codebook design has been exemplarily described in respect of the Equations 22 and 23, the codebooks of W1 and W2 may be designed in accordance with the same principle in case of rank more than 2. For example, in case of rank 2, in the Equations 22 and 23, $W_{1j}$ may be replaced with $W_{2j}$ (in this case, $W_{2j}$ means the jth codeword when rank is 2 (number of layers=2) in the 4Tx codebook defined in the LTE release-8 system as illustrated in Table 1), and in the Equations 22 and 23, the codeword $e_M{}^i$ of W2 may be replaced with $[e_{2M}{}^{2i-1}\ e_{2M}{}^{2i}]$, whereby the codebooks of W1 and W2 may be generated.

Embodiment 4

In the aforementioned Embodiments, W1 corresponds to precoding information (or PMI) on long term-wideband attributes, and W2 corresponds to precoding information (or PMI) on short term-subband attributes. Also, when final PMI (that is, W) is expressed by multiplication of W1 and W2 on the basis of the above hierarchical structure, the examples of the codebooks of W1 and W2 have been described. In this Embodiment 4, a structure for determining final PMI by additionally defining long term-wideband attributes will be described. In other words, a codebook structure of the following Equation 24 may be defined.

$$W=f(W0,W1,W2) \quad \text{[Equation 24]}$$

In the Equation 24, W0 and W1 is PMI of long term-wideband attributes, and W2 is PMI of short term-subband attributes.

In the Equation 24, f(W1, W1, W2) may be a function that includes factors W0, W1 and W2. For example, f(W0, W1, W2)=W0×W1×W2 may be defined. In this case, W0 may be defined as a diagonal matrix of Nt×Nt size, W1 may be defined as a matrix of Nt×p size, and W2 may be defined as a matrix of p×r size. For example, in case of Nt=8, the codebook may be configured for rank 1 as expressed by the following Equation 25.

$$W = W0 W1 W2, \quad \text{[Equation 25]}$$

$$W0 = \left\{\begin{bmatrix} D_i & 0 \\ 0 & D_j \end{bmatrix} \middle| i=0,1,\ldots,x,\ j=0,1,\ldots,x\right\},$$

$$W1 = \left\{\begin{bmatrix} c_k & 0 \\ 0 & c_k \end{bmatrix} \middle| k=0,1,\ldots,y\right\}$$

$$W2 = \left\{\begin{bmatrix} 1 \\ \alpha_1 \end{bmatrix} \middle| l=0,1,\ldots,z\right\}$$

In the Equation 25, W0 is a diagonal matrix of 8×8 size, W1 is a matrix of 8×2 size, and W2 is a matrix (or column vector) of 2×1 size.

In the Equation 25, $D_i$ is a diagonal matrix of 4×4, and diagonal components of W0 may be designed such that phase is increased linearly. For example, $D_i$ may be $\{e^\theta, e^{j\theta}, e^{j2\theta}, e^{j3\theta}\}$. In other words, the diagonal components of W0 may correspond to columns of an extended DFT matrix. In the Equation 25, $C_k$ of W1 is a column vector of 4×1 size, and each element of the column vector may be designed such that phase is increase linearly. In the Equation 25, $\alpha_i$ of W2 may be a complex number of which size is 1, and may have a value such as 1, −1, j, −j, etc., for example.

The aforementioned PMI structure may reflect channel correlation features of cross-pol (X-pol) antennas of which intervals are compact. For example, 8Tx cross-pol antennas may be configured by two antenna groups with polarization, which are orthogonal to each other. In this case, the antennas (antennas 1, 2, 3 and 4) of the antenna group 1 may have the same polarization (for example, vertical polarization), and the antennas (antennas 5, 6, 7 and 8) of the antenna group 2 may have the same polarization (for example, horizontal polarization). In other words, the antennas within one antenna group may have the same polarization and phase difference in accordance with their positions in the same manner as ULA. Also, the antennas 1 and 5 may be arranged at the same position, the antennas 2 and 6 may be arranged at the same position, the antennas 3 and 7 may be arranged at the same position, and the antennas 2 and 8 may be arranged at the same position. As a result, many antennas may be configured in a narrow space, and antenna channels orthogonal to one another without interference using orthogonal polarization may be configured.

For example, In the Equation 25, W(=W0×W1×W2) is a column vector of 8×1 size, wherein four upper elements represent channel correlation features among the antennas of vertical polarization, and four lower elements represent channel correlation features among the antennas of horizontal polarization. Also, phase difference as much as $\alpha_i$ occurs between the four upper elements and the four lower elements of W, and means physical phase difference between the vertical polarization antennas and the horizontal polarization antennas.

In the aforementioned example, although the method for configuring the codebook of rank 1 has been described, the codebook of rank 2 or more may be designed in accordance with the same principle. For example, W2 in the Equation 25 may be configured for rank 2 as expressed by the following Equation 26, whereby the codebook of rank 2 may be designed.

$$W2 = \left\{ \begin{bmatrix} 1 & 1 \\ \alpha_1 & -\alpha_1 \end{bmatrix}, \begin{bmatrix} 1 & 1 \\ j\alpha_1 & -j\alpha_1 \end{bmatrix} \middle| l = 0.1, \ldots, z \right\}$$ [Equation 26]

Figure 12:
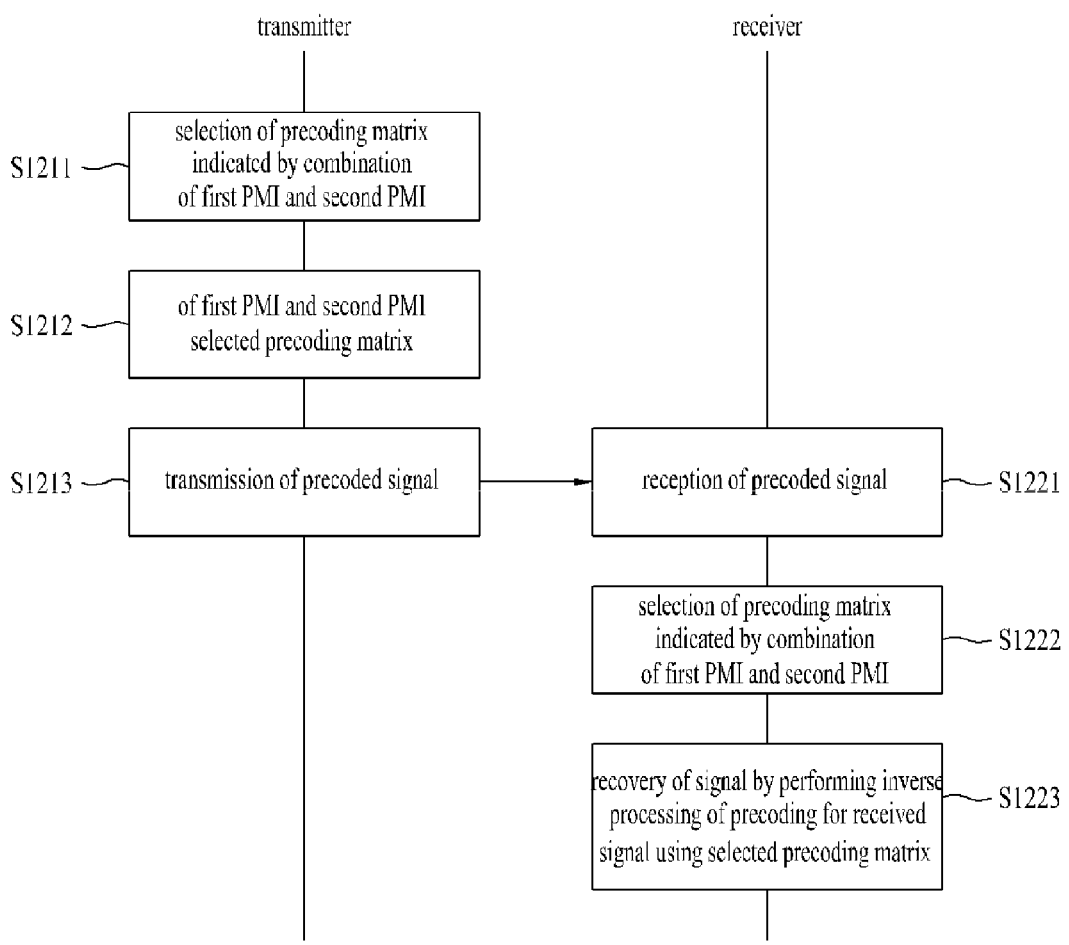
FIG. 12 is a flow chart illustrating a method for transmitting and receiving channel status information in accordance with the embodiment of the present invention.

FIG. 12 is a flow chart illustrating a method for transmitting and receiving a precoding signal in accordance with the embodiment of the present invention.

At step S1211, the transmitter may select a precoding matrix indicated by combination of the first PMI and the second PMI. In this case, the first PMI and the second PMI may be PMIs fed back from the receiver. The receiver may determine the first PMI and the second PMI by measuring a channel from the transmitter and may feed the determined PMIs back to the transmitter. Alternatively, the first PMI and the second PMI may be the PMIs selected properly by the transmitter considering the PMI fed back from the receiver. At step S1212, the transmitter may perform precoding for the signal, which will be transmitted to the receiver, by using the selected precoding matrix. At step S1213, the transmitter may transmit the precoded signal to the receiver through the Nt number of transmitting antennas.

At step S1221, the receiver may receive the signal from the transmitter. At step S1222, the receiver may select the precoding matrix indicated by combination of the first PMI and the second PMI. Selection of this procoding matrix may be given by the transmitter. At step S1223, the receiver may recover the signal by performing inverse processing of precoding for the received signal by using the selected precoding matrix.

As described above, the precoding matrix W used for precoding processing or inverse processing of precoding by the transmitter and the receiver may be indicated by multiplying one matrix group indicated by the first PMI among matrix groups included in the first codebook (for example, codebook W1) by the matrix indicated by the second PMI among the matrixes included in the second codebook (for example, codebook W2).

The first PMI may indicate one of N number of matrix groups (N≥1). In this case, a set of the N number of matrix groups may be referred to as the first codebook (for example, codebook W1). The matrixes constituting the first codebook may correspond to the matrixes representing a channel direction related to the Nt number of antennas of the transmitter. Also, if the number of columns of each of the matrixes of the first codebook is 1, it may be expressed that the first codebook may be configured by N number of column vectors.

Each matrix group may include matrixes of high correlation. Alternatively, each matrix group may include a plurality of subgroups orthogonal to one another, wherein each subgroup may include matrixes of high correlation. This is because that the first codebook is configured as a vector indicating a long term-wideband channel direction and the long term-wideband channel direction is expressed by two orthogonal singular vectors. In other words, this is intended that one of the subgroups may express the first singular vector and the other one of the subgroups may express the second singular vector.

The first codebook may be configured by one group only. In other words, N=1 is obtained, and the first codebook may be configured to include all the precoding matrixes that may be selected. In this case, since it means that one matrix group which is fixed is used, the first PMI may not indicate what matrix group is used.

The matrix indicated by the second PMI is the matrix that applies one or more of phase rotation, size modification and vector selection to the one matrix group indicated by the first PMI.

Alternatively, the first PMI may be expressed by two different PMIs (third PMI and fourth PMI). The third PMI may indicate one of diagonal matrixes of Nt×Nt size, and diagonal components in each diagonal matrix may be configured such that phase is increased linearly. The fourth PMI may indicate one of block diagonal matrixes of Nt×p size (for example, p=2), one block in each diagonal matrix may be configured as a matrix of (Nt/2)×1 size, and components of one block may be configured such that phase is increased linearly. In this case, the second PMI may indicate one of matrixes of p×R size (for example, p=2), and upper row(s) and lower row(s) of the second PMI may be configured to have phase difference of α. In this case, R corresponds to the number of layers (that is, rank value) to which a signal is transmitted.

The matters described in the aforementioned various embodiments of the present invention as the methods for configuring first and second codebooks may independently be applied to the method for transmitting and receiving a precoded signal, as described with reference to FIG. 12, or two or more embodiments may be applied to the method for transmitting and receiving a precoded signal. The repeated description will be omitted for clarification.

Also, in the description of FIG. 12, the transmitter may be the base station and the receiver may be the user equipment, or vice versa. Also, the operation of the transmitter may equally be applied to a relay station as a downlink transmission entity, and the operation of the receiver may equally be applied to a relay station as a downlink reception entity.

Figure 13:
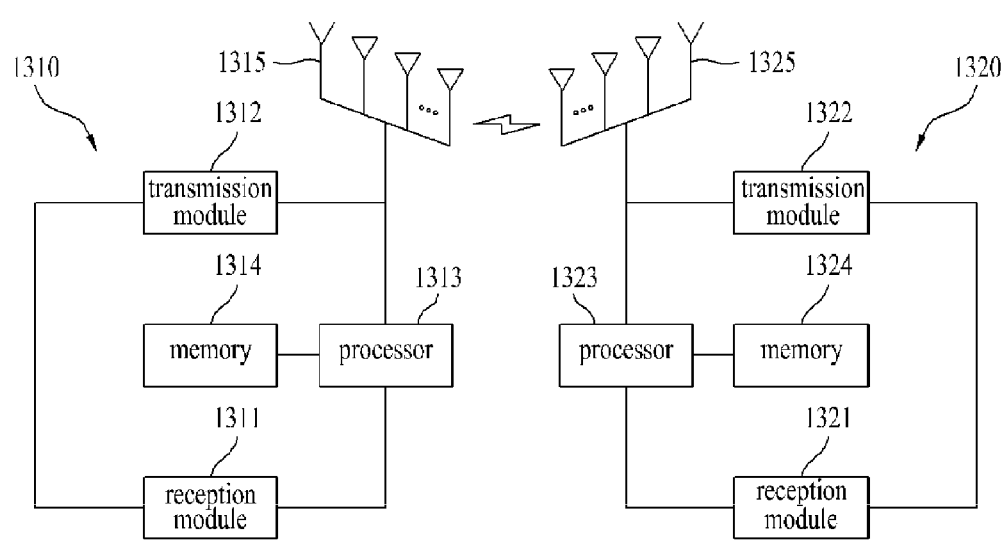
FIG. 13 is a diagram illustrating a configuration of a base station and a user equipment according to the present invention.

FIG. 13 is a diagram illustrating a configuration of a transmitter and a receiver according to the present invention.

Referring to FIG. 13, the transmitter 1310 according to the present invention may include a reception module 1311, a transmission module 1312, a processor 1313, a memory 1314 and a plurality of antennas 1315. The plurality of antennas 1315 mean the transmitter that supports MIMO transmission and reception. The processor 1313 may control the overall operation of the transmitter 1310.

The transmitter 1310 according to one embodiment of the present invention may be configured to transmit the precoded signal to the receiver. The transmitter 1310 may include Nt number of antennas 1315, and may store a codebook used for selection of the precoding matrix in the memory 1314. The processor 1313 of the transmitter may be configured to select the precoding matrix indicated by combination of the first PMI and the second PMI. Also, the processor 1313 may be configured to precode the signal by using the selected precoding matrix. Moreover, the processor 1313 may be configured to transmit the precoded signal through the transmission module 1312 and the Nt number of antennas 1315. In this case, the first PMI may indicate one of N number of matrix groups (N≥1) configured by matrixes indicating a channel direction related to the Nt number of antennas. Also, the precoding matrix used by the transmitter may be selected by multiplication of one matrix group indicated by the first PMI and the matrix indicated by the second PMI.

The processor 1313 of the transmitter 1310 may perform operation process of information received by the transmitter 1310 and information to be transmitted to the outside, and the memory 1314 may store the operation processed information for a predetermined time and may be replaced with a buffer (not shown).

Referring to FIG. 13, the receiver 1320 according to the present invention may include a reception module 1321, a transmission module 1322, a processor 1323, a memory 1324, and a plurality of antennas 1325. The plurality of antennas 1325 mean the user equipment that supports MIMO transmission and reception. The processor 1323 may control the overall operation of the receiver 1320.

The transmitter 1320 according to one embodiment of the present invention may be configured to receive the precoded signal from the transmitter 1310 that includes Nt number of transmitting antennas. The receiver 1320 may store a codebook used for selection of the precoding matrix in the memory 1314. The processor 1323 of the receiver may be configured to receive the signal from the transmitter 1310 through the reception module 1321. Also, the processor 1323 may be configured to select the precoding matrix indicated by combination of the first PMI and the second PMI. Also, the processor 1323 may be configured to recover the signal by performing inverse processing of precoding for the received signal by using the selected precoding matrix. In this case, the first PMI may indicate one of N number of matrix groups (N≥1) configured by matrixes indicating a channel direction related to the Nt number of antennas of the transmitter 1310. Also, the precoding matrix used by the receiver may be selected by multiplication of one matrix group indicated by the first PMI and the matrix indicated by the second PMI.

In addition, the processor 1323 of the receiver 1320 may perform operation process of information received by the receiver 1320 and information to be transmitted to the outside, and the memory 1324 may store the operation processed information for a predetermined time and may be replaced with a buffer (not shown).

The matters described in the aforementioned various embodiments of the present invention as the method for configuring a codebook that includes predetermined matrixes may independently be applied to the configuration of the transmitter and the receiver as described with reference to FIG. 13, or two or more embodiments may be applied to the configuration of the transmitter and the receiver. The repeated description will be omitted for clarification.

Also, in the description of FIG. 13, the transmitter may be the bases station and the receiver may be the user equipment, or vice versa. Also, the operation of the transmitter may equally be applied to the relay station as the downlink transmission entity, and the description of the receiver may equally be applied to the relay station as the downlink reception entity.

The aforementioned embodiments according to the present invention may be implemented by various means, for example, hardware, firmware, software, or their combination.

If the embodiment of the present invention is implemented by hardware, the method according to the embodiments of the present invention may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, etc.

If the embodiment according to the present invention is implemented by firmware or software, the method according to the embodiments of the present invention may be implemented by a type of a module, a procedure, or a function, which performs functions or operations described as above. A software code may be stored in a memory unit and then may be driven by a processor. The memory unit may be located inside or outside the processor to transmit and receive data to and from the processor through various means which are well known.

Those skilled in the art will appreciate that the present invention may be carried out in other specific ways than those set forth herein without departing from the spirit and essential characteristics of the present invention. It is also obvious to those skilled in the art that claims that are not explicitly cited in each other in the appended claims may be presented in combination as an embodiment of the present invention or included as a new claim by a subsequent amendment after the application is filed.

The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein.

INDUSTRIAL APPLICABILITY

The aforementioned embodiments of the present invention may be applied to various mobile communication systems.

The invention claimed is:

1. A method for transmitting a signal from a transmitter, which supports Nt antennas, to a receiver, the method comprising:
   selecting a precoding matrix indicated by a combination of a first precoding matrix indicator (PMI) and a second PMI;
   precoding the signal by using the selected precoding matrix; and
   transmitting the precoded signal through the Nt antennas,
   wherein the first PMI indicates one matrix group among N matrix groups (N≥1) including matrices representing channel directions related to the Nt antennas, and the precoding matrix is selected by multiplying the one matrix group indicated by the first PMI by the matrix indicated by the second PMI, and
   wherein the first PMI is indicated by a third PMI and a fourth PMI, the third PMI indicates one of diagonal matrices of Nt×Nt size, the fourth PMI indicates one of block diagonal matrices of Nt×2 size, the second PMI indicates one of matrices of 2×R size, and R is the number of layers to which the signal is transmitted.

2. The method according to claim 1, wherein the matrix indicated by the second PMI is the matrix that applies one or more of phase rotation, size modification and vector selection to the one matrix group indicated by the first PMI.

3. The method according to claim 1, wherein each of the N matrix groups includes matrices of high correlation, or each of the N matrix groups includes a plurality of subgroups orthogonal to one another, each of the subgroups including matrices of high correlation.

4. The method according to claim 1, wherein N=1, and the one matrix group related to the first PMI includes all the precoding matrices that may be selected.

5. The method according to claim 1, wherein diagonal components in each of the diagonal matrices related to the third PMI are configured such that phase is increased linearly, one block in each of the block diagonal matrices related to the fourth PMI are configured as a matrix of (Nt/2)×1 size and components of the one block are configured such that phase is increased linearly, and first and second rows of the second PMI are configured to have a phase difference of $\alpha$.

6. A method for processing a signal transmitted from a transmitter, which supports Nt antennas, through a receiver, the method comprising:
   receiving the signal from the transmitter;
   selecting a precoding matrix indicated by a combination of a first precoding matrix indicator (PMI) and a second PMI; and recovering the signal by performing inverse processing of precoding for the received signal by using the selected precoding matrix, wherein the first PMI indicates one matrix group among N matrix groups (N≥1) including matrices representing channel directions related to the Nt antennas, and the precoding matrix is selected by multiplying the one matrix group indicated by the first PMI by the matrix indicated by the second PMI, and wherein the first PMI is indicated by a third PMI and a fourth PMI, the third PMI indicates one of diagonal matrices of Nt×Nt size, the fourth PMI indicates one of block diagonal matrices of Nt×2 size, the second PMI indicates one of matrices of 2×R size, and R is the number of layers to which the signal is transmitted.

7. The method according to claim 6, wherein the matrix indicated by the second PMI is the matrix that applies one or more of phase rotation, size modification and vector selection to the one matrix group indicated by the first PMI.

8. The method according to claim 6, wherein each of the N matrix groups includes matrices of high correlation, or each of the N matrix groups includes a plurality of subgroups orthogonal to one another, each of the subgroups including matrices of high correlation.

9. The method according to claim 6, wherein N=1, and the one matrix group related to the first PMI includes all the precoding matrices that may be selected.

10. The method according to claim 6, wherein diagonal components in each of the diagonal matrices related to the third PMI are configured such that phase is increased linearly, one block in each of the block diagonal matrices related to the fourth PMI are configured as a matrix of (Nt/2)×1 size and components of the one block are configured such that phase is increased linearly, and first and second rows of the second PMI are configured to have a phase difference of $\alpha$.

11. A transmitter comprising:
Nt antennas;
a transmission module configured to transmit a signal to a receiver;
a reception module configured to receive the signal from the receiver; and
a processor configured to control an operation of the transmitter,
wherein the processor is further configured to select a precoding matrix indicated by a combination of a first precoding matrix indicator (PMI) and a second PMI, precode the signal by using the selected precoding matrix, and transmit the precoded signal through the Nt antennas, wherein the first PMI indicates one matrix group among N matrix groups (N≥1) including matrices representing channel directions related to the Nt antennas, wherein the precoding matrix is selected by multiplying the one matrix group indicated by the first PMI by the matrix indicated by the second PMI, and wherein the first PMI is indicated by a third PMI and a fourth PMI, the third PMI indicates one of diagonal matrices of Nt×Nt size, the fourth PMI indicates one of block diagonal matrices of Nt×2 size, the second PMI indicates one of matrices of 2×R size, and R is the number of layers to which the signal is transmitted.

12. A receiver comprising:
a reception module configured to receive a signal from a transmitter which includes Nt antennas;
a transmission module configured to transmit the signal to the transmitter; and
a processor configured to control an operation of the receiver,
wherein the processor is further configured to receive the signal from the transmitter through the reception module, select a precoding matrix indicated by a combination of a first precoding matrix indicator (PMI) and a second PMI, and recover the signal by performing inverse processing of precoding for the received signal by using the selected precoding matrix, wherein the first PMI indicates one matrix group among N matrix groups (N≥1) including matrices representing channel directions related to the Nt antennas, wherein the precoding matrix is selected by multiplying the one matrix group indicated by the first PMI by the matrix indicated by the second PMI, and wherein the first PMI is indicated by a third PMI and a fourth PMI, the third PMI indicates one of diagonal matrices of Nt×Nt size, the fourth PMI indicates one of block diagonal matrices of Nt×2 size, the second PMI indicates one of matrices of 2×R size, and R is the number of layers to which the signal is transmitted.

* * * * *